United States Patent
Watanabe et al.

[11] Patent Number: 6,111,246
[45] Date of Patent: *Aug. 29, 2000

[54] SEMICONDUCTOR DEVICE TESTING APPARATUS HAVING PRESENCE OR ABSENCE DETECTORS ISSUING AN ALARM WHEN AN ERROR OCCURS

[75] Inventors: Yutaka Watanabe, Kumagaya; Hiroto Nakamura, Kazo; Toshio Yabe, Oota; Michirou Chiba, Kitasaitama-gun, all of Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/832,774

[22] Filed: Apr. 4, 1997

[30] Foreign Application Priority Data

Apr. 5, 1996 [JP] Japan .................................. 8-083430
Dec. 4, 1996 [JP] Japan .................................. 8-324151

[51] Int. Cl.$^7$ .................................................. H01J 40/14
[52] U.S. Cl. ................................. 250/222.1; 250/223 R; 209/573; 324/158.1
[58] Field of Search ........................... 250/222.1, 223 R; 209/573, 571; 324/158.1

[56] References Cited

U.S. PATENT DOCUMENTS

| | | | |
|---|---|---|---|
| 3,655,041 | 4/1972 | Baker et al. ............................... | 209/81 |
| 3,896,935 | 7/1975 | Hjelle et al. .............................. | 209/81 |
| 4,170,290 | 10/1979 | Frisbie et al. ........................... | 198/524 |
| 4,724,965 | 2/1988 | Willberg .................................. | 209/573 |
| 4,776,747 | 10/1988 | Swapp et al. ............................ | 414/417 |
| 4,869,636 | 9/1989 | Reid et al. ............................... | 414/331 |
| 4,926,118 | 5/1990 | O'Conner et al. ..................... | 324/158 F |
| 5,307,011 | 4/1994 | Tani ....................................... | 324/158 F |
| 5,313,156 | 5/1994 | Klug et al. ............................. | 324/158 F |
| 5,319,353 | 6/1994 | Ohnishi et al. ......................... | 340/525 |
| 5,465,850 | 11/1995 | Kase ....................................... | 209/573 |
| 5,516,028 | 5/1996 | Rasp et al. . | |
| 5,686,834 | 11/1997 | Okudaira et al. .................... | 324/158.1 |
| 5,772,387 | 6/1998 | Nakamura et al. . | |
| 5,788,084 | 8/1998 | Onishi et al. .......................... | 209/573 |

FOREIGN PATENT DOCUMENTS

| | | | |
|---|---|---|---|
| 660104 | 3/1963 | Canada ................................ | 198/573 |
| 60-35279 | 2/1985 | Japan . | |
| 61-290373 | 12/1986 | Japan . | |
| 62-021533 | 2/1987 | Japan . | |
| 62-092645 | 6/1987 | Japan . | |
| 3-039665 | 2/1991 | Japan . | |
| 3-138956 | 6/1991 | Japan . | |
| 3-141657 | 6/1991 | Japan . | |
| 4-343077 | 11/1992 | Japan . | |
| 6-058986 | 3/1994 | Japan . | |
| 6-095125 | 11/1994 | Japan . | |
| 8-15373 | 1/1996 | Japan . | |

*Primary Examiner*—Que T. Le
*Assistant Examiner*—Thanh X. Luu
*Attorney, Agent, or Firm*—Staas & Halsey

[57] ABSTRACT

A semiconductor device testing apparatus in which ICs to be tested are transferred to a test tray TST in a loader section, the test tray is transported into a test section to test the ICs, after the completion of the test, the tested ICs on the test tray are transferred from the test tray onto a general-purpose tray in an unloader section, and the test tray which has been emptied of the tested ICs is transported to the loader section, and the above operation is repeated, and which can detect whether there is an IC on the test tray or not is provided. An IC detecting sensor for monitoring whether an IC exists on the test tray or not is provided at at least one of the positions between the unloader section and the loader section, the loader section and the test section, and the test section and the unloader section. A through-hole is provided in the bottom portion of each IC carrier mounted to the test tray, and whether an IC carrier mounted to the test tray is empty or not is determined by detecting light transmitted through the through-hole by the IC detecting sensor.

31 Claims, 12 Drawing Sheets

SEMICONDUCTOR DEVICE TESTING APPARATUS HAVING PRESENCE OR ABSENCE DETECTORS ISSUING AN ALARM WHEN AN ERROR OCCURS

BACKGROUND OF THE INVENTION

1. Field of the Invention

The present invention relates to a semiconductor device testing apparatus suitable for testing one or more semiconductor devices, particularly one or more semiconductor integrated circuit elements (as will be referred to as IC or ICs hereinafter) which are typical examples of the semiconductor devices. More particularly, the present invention relates to a semiconductor device testing apparatus equipped with a semiconductor device transporting and processing or handling apparatus of the type which is adapted to transport semiconductor devices to be tested, for testing, to a test or testing section where they are brought into electrical contact with a tester head (a component of the testing apparatus for applying and receiving various electrical signals for testing) to perform an electrical test of the semiconductor devices, after the testing, carry the tested semiconductor devices out of the test section, and to sort out the tested semiconductor devices into conformable or pass articles and unconformable or failure articles on the basis of the test results.

2. Description of the Related Art

Many of electrical portions (commonly called tester part) of semiconductor device testing apparatus for applying a test signal of a predetermined pattern to a semiconductor device to be tested, i.e. device under test (commonly called DUT) and measuring the electrical characteristics of the devices, have a semiconductor device transporting and handling or processing apparatus (commonly called handler) connected thereto which transports semiconductor devices to a test section, brings them into electrical contact with a tester head in the test section, after the testing, carries the tested semiconductor devices out of the test section, and sorts them out into pass articles and failure articles on the basis of the test results. In the following disclosure the present invention will be described by taking ICs typical of semiconductor devices for example for clarity of explanation.

A description will be given first regarding the general construction of a conventional IC testing apparatus having a handler called "horizontal transporting system" mounted thereto with reference to FIGS. 9 and 10. The illustrated IC testing apparatus comprises a chamber section 100 for testing ICs such as semiconductor memories which are loaded on a test tray TST and carried on the test tray TST, an IC storage section 200 where ICs which will undergo a test (i.e., ICs to be tested) are sorted out and the tested ICs are sorted out and stored in place, a loader section 300 where ICs to be tested which a user has beforehand loaded on a general-purpose tray (customer tray) KST are transferred and reloaded onto a test tray TST capable of withstanding high/low temperatures, and an unloader section 400 where the tested Ics which have been carried on the test tray TST out of the chamber section 100 subsequently to undergoing a test in the testing chamber 100 are transferred from the test tray TST to one or more general-purpose trays KST to be reloaded on the latter. The unloader section 400 is generally constructed to sort out the tested ICs by categories on the basis of the data of the test results and load them on the corresponding general-purpose trays.

The chamber section 100 comprises a constant temperature or thermostatic chamber 101 for receiving the ICs to be tested loaded on the test tray TST and imposing an intended high or low temperature stress to the ICs, a test or testing chamber 102 for effecting an electrical test on the ICs subjected to the temperature stress in the constant temperature chamber 101, and a temperature-stress removing chamber 103 for removing the temperature stress of the ICs having been applied thereto in the test chamber 102 from the ICs. The test chamber 102 contains therein a tester head 104 of the testing apparatus, supplies various electric signals for testing via the tester head 104 to the ICs under test in electrically contact therewith, receives response signals from the ICs, and sends them to the testing apparatus.

Each of the test trays TST is moved in a circulating manner from the loader section 300 through the constant temperature chamber 101 of the chamber section 100, the test chamber 102 of the chamber section 100, the temperature-stress removing chamber 103 of the chamber section 100, and the unloader section 400 in this order, to the loader section 300. The constant temperature chamber 101 and the temperature-stress removing chamber 103 are taller than the test chamber 102, and have upward portions protruding beyond the top of the test chamber 102, respectively. As shown in FIG. 10, a base plate 105 spans between the upward protruding portions of the constant temperature chamber 101 and the temperature-stress removing chamber 103, and a test tray conveying means 108 is mounted on the base plate 105 to transport the test tray TST from the temperature-stress removing chamber 103 to the constant temperature chamber 101.

In case a temperature stress of a high temperature (a thermal stress) has been applied to the ICs to be tested in the constant temperature chamber 101, the temperature-stress removing chamber 103 cools the tested ICs down to room temperature by blowing, after which they are transported to the unloader section 400. On the other hand, in case a temperature stress of a low temperature such as, for instance, −30° C. (a cryogenic stress) has been applied to the ICs to be tested in the constant temperature chamber 101, the temperature-stress removing chamber 103 heats the tested ICs by warm air or a heater up to a temperature at which the ICs have no any dew condensation, and then they are carried out of the temperature-stress removing chamber 103 to the unloader section 400.

The test tray TST with the ICs loaded thereon in the loader section 300 is conveyed from the loader section to the constant temperature chamber 101 within the chamber section 100. The constant temperature chamber 101 has a vertical conveyor means mounted therein which is adapted to support a plurality of (nine, for instance) test trays TST in the form of a stack. In the illustrated example, the vertical conveyor means stacks the transported test trays such that a test tray newly received from the loader section 300 is supported at the uppermost of the stack while the bottom test tray is delivered to the test chamber 102. The ICs to be tested on the uppermost test tray TST are given a predetermined high or low temperature stress while the associated test tray TST is moved sequentially from the top to the bottom of the stack by vertically downward movement of the vertical conveyor means and/or waits till the immediately preceding test tray is brought out of the test chamber 102. The tester head 104 is disposed in the test chamber 102 at the central area thereof, and each of the test trays TST carried out one by one from the constant temperature chamber 101 is conveyed onto the tester head 104 while maintained at the constant temperature, and a predetermined number of the ICs among the ICs on the associated test tray TST are electrically connected to IC sockets (not shown) mounted on the tester head 104, as will be discussed hereinbelow. Upon completion of the test on all of the ICs placed on one test tray TST through the tester head 104, the test tray TST is transported to the temperature-stress removing chamber 103 where the tested ICs on the associated test tray are relieved of temperature stress to be restored to the ambient or room temperature, and thereafter the test tray TST is discharged to the unloader section 400.

Like the constant temperature chamber 101 as described above, the temperature-stress removing chamber 103 is also equipped with a vertical conveyor means adapted to support a plurality of (nine, for instance) test trays TST stacked one on another. In the illustrated example, the test tray TST newly received from the test chamber 102 is supported at the bottom of the stack while the uppermost test tray is discharged to the unloader section 400. The tested ICs on the associated test tray are relieved of temperature stress to be restored to the outside temperature (room temperature) as the associated test tray TST is moved from the bottom to the top of the stack by vertically upward movement of the vertical conveyor means.

The tested ICs as carried on the test tray TST are passed to the unloader section 400 where they are sorted out by categories based on the test results and transferred from the test tray TST onto and stored in the corresponding general-purpose trays for respective categories. The test tray TST thus emptied in the unloader section 400 is transported to the loader section 300 where it is again loaded with ICs to be tested from a general-purpose tray KST onto the test tray TST, after which the same steps of above-described operation are repeated.

AS shown in FIG. 10, an IC transfer means for transferring ICs from a general-purpose tray KST to a test tray TST in the loader section 300 may be in the form of X and Y direction transfer means 304 which comprises a pair of spaced parallel rails 301 mounted on the base plate 105 and extending over the loader section 400 in the front-to-back or forward-rearward direction of the testing apparatus (referred to as the Y direction herein), a movable arm 302 which spans between the two rails 301 and has its opposite ends secured thereto in a manner to be movable in the Y direction, and a movable head 303 which is supported by the movable arm 302 in a manner to be movable in the direction in which the movable arm 302 extends, that is. in the left to right direction of the testing apparatus (referred to as the X direction herein). With this arrangement, the movable head 303 is allowed to reciprocate between the test tray TST and the general-purpose tray KST in the Y direction and move along the movable arm 302 in the X direction.

On the underside of the movable head 303 are vertically movably mounted IC suction pads. Through the movement of the movable head 303 in the X and Y directions and the downward movement of the suction pads in combination, the suction pads are brought into abutment with the ICs placed on the general-purpose tray KST and pick them up and hold thereto by vacuum suction to transfer them to the test tray TST. The number of suction pads that are mounted on the movable head 303 may be eight, for instance, so that a total of eight ICs may be transferred from the general-purpose tray KST to the test tray TST at one time.

It is to be noted here that means 305 for correcting the position of an IC called "preciser" is located between stopping positions for the general-purpose tray KST and the test tray TST. The position correcting means 305 includes relatively deep recesses into which the ICs as being attracted against the suction pads are once released to fall prior to being transferred to the test tray TST. The recesses are each defined by vertical tapered side walls which prescribe for the positions at which the ICs drop into the recesses by virtue of the tapering. After eight ICs have been precisely positioned relative to each other by the position correcting means 305, those eight ICs accurately positioned are again attracted against the suction pads and conveyed to the test tray TST. The reason that the position correcting means 305 is provided is as follows. Recesses of the general-purpose tray TST for holding the ICs are sized larger as compared to the size of ICs, resulting in wide variations in positions of ICs placed on the general-purpose tray KST. Consequently, if the ICs as such were vacuum picked up by the suction pads and transferred directly to the test tray TST, there might be some of the ICs which could not be successfully deposited into the IC storage recesses formed in the test tray TST. This is the reason for requiring the position correcting means 305, as described above which acts to array ICs as accurately as the array of the IC storage recesses formed in the test tray TST.

The unloader section 400 is equipped with two sets of X and Y direction transfer means 404 which are identical in construction to the X and Y direction transfer means 304 provided for the loader section 300. The X and Y direction transfer means 404 perform to transship the tested ICs from the test tray TST delivered out to the unloader section 400 onto the general-purpose tray KST. Each set of the X and Y direction transfer means 404 comprises a pair of spaced parallel rails 401 mounted to extend in the forward-rearward direction of the testing apparatus (Y direction), a movable arm 402 spanning between the pair of rails 401 and movably mounted at opposite ends on the pair of rails 401 in the Y direction, and a movable head 403 mounted on the movable arm 402 for movement therealong longitudinally of the arm, that is, in the right to left direction of the testing apparatus (X direction).

FIG. 11 shows the construction of one example of the test tray TST. The illustrated test tray TST comprises a rectangular frame 12 having a plurality of equally spaced apart parallel cleats 13 between the opposed side frame members 12a and 12b of the frame, each of the cleats 13 having a plurality of equally spaced apart mounting lugs 14 protruding therefrom on both sides thereof and each of the side frame members 12a, 12b opposing the adjacent cleats having similar mounting lugs 14 protruding therefrom. The mounting lugs 14 protruding from the opposed sides of each of the cleats 13 are arranged such that each of the mounting lugs 14 protruding from one side of the cleat 13 is positioned intermediate two adjacent mounting lugs 14 protruding from the opposite side of the cleat. Similarly, each of the mounting lugs 14 protruding from each of the side frame members 12a and 12b is positioned intermediate two adjacent mounting lugs 14 protruding from the opposed cleat. Formed between each pair of opposed cleats 13 and between each of the side frame members 12a and 12b and the opposed cleats are spaces for accommodating a multiplicity of IC carriers 16 in juxtaposition. More specifically, each IC carrier 16 is accommodated in one of an array of rectangular carrier compartments 15 defined in each of said spaces, each compartment 15 including two staggered, obliquely opposed mounting lugs 14 located at the diagonally opposed corners of the compartment. In the illustrated example wherein each cleat 13 has sixteen mounting lugs 14 on either side thereof, there are sixteen carrier compartments 15 formed in each of said spaces, in which sixteen IC carriers 16 are mounted. Since there are four of the spaces, 16×4, that is, 64 IC carriers in total can be mounted in one test tray TST. Each IC carrier 16 is placed on corresponding two mounting lugs 14 and fixed thereto by fasteners 17.

Each of IC carriers 16 is of identical shape and size in its outer contour and has an IC pocket 19 in the center for accommodating an IC element therein. The shape and size of the IC pocket 19 is determined depending on those of the IC element 18 to be accommodated therein. In the illustrated example, the IC pocket 19 is in the shape of a generally square recess. The outer dimensions of the IC pocket 19 are sized so as to be loosely fitted in the space defined between the opposed mounting lugs 14 in the carrier compartment 15. The IC carrier 16 has flanges at its opposed ends adapted to rest on the corresponding mounting lugs 14, these flanges having mounting holes 21 and holes 22 formed therethrough, respectively, the mounting holes 21 being adapted to receive fasteners 17 therethrough and the holes 22 being adapted to pass locating pins therethrough.

In order to prevent IC elements from slipping out of place within the IC carrier 16 or jumping out of the IC carrier 16, a pair of latches 23 are attached to the IC carrier 16, as shown in FIG. 12. These latches 23 are integrally formed with the body of the IC carrier so as to extend upwardly from the base of the IC pocket 19, and are normally resiliently biased such that the top end pawls are urged toward each other by virtue of the resiliency of the resin material of which the IC carrier is made. When the IC element is to be deposited into or removed from the IC pocket 19, the top ends of the two latches 23 are expanded away from each other by a latch releasing mechanism 25 disposed on opposite sides of an IC suction pad 24 for picking up an IC element prior to effectuating the deposition of the IC element into or removal from the IC pocket 19. Upon the latch releasing mechanism 25 being moved out of engagement with the latches 23, the latches 23 will snap back to their normal positions by their resilient forces where the deposited IC is held in place against dislodgement by the top end pawls of the latches 23.

The IC carrier 16 holds an IC element in place with its leads or pins 18 exposed downwardly as shown in FIG. 13. The tester head 104 has an IC socket mounted thereto, and contacts 104A of the IC socket upwardly extend from the top surface of the tester head 104. The exposed leads 18 of the IC element are pushed against the contacts 104A of the IC socket to establish electrical connection between the IC element and the socket. To this end, a pusher 20 for pushing and holding an IC element down is mounted above the tester head 104 and is configured to push the IC element accommodated in an IC carrier 16 from above into contact with the tester head 104.

It is to be noted that there is another type of IC handler in which ICs to be tested are transferred from the test tray into a socket mounted on the tester head 104 and upon the test being completed the tested ICs are transferred from the socket back onto the test tray to transport the ICs, in the test chamber 102.

The IC storage section 200 comprises an IC storage rack (or stocker) 201 for accommodating general-purpose trays KST loaded with ICs to be tested and a tested IC storage rack (or stocker) 202 for accommodating general-purpose trays KST loaded with tested ICs sorted out by categories on the basis of the test results. The IC storage rack 201 and tested IC storage rack 202 are configured to accommodate general-purpose trays in the form of a stack. The general-purpose trays KST with ICs to be tested carried thereon and stored in the form of a stack in the IC storage rack 201 are transported successively from the top of the stack to the loader section 300 where the ICs to be tested (DUTS) are transferred from the general-purpose tray KST onto a test tray TST on standby in the loader section 300. Further, the IC storage rack 201 and the tested IC storage rack may be of identical shape, configuration and structure.

In the example illustrated in FIGS. 9 and 10, eight racks STK-1, STK-2, . . . , STK-8 are provided as tested IC storage racks 202 so as to be able to store tested ICs which may be sorted out into eight categories at a maximum according to the test results. This is because in some applications tested ICs may not only be classified into categories of "conformable or pass article" and "unconformable or failure article" but also be subclassified into those having high, medium and low operation speeds among the "pass" articles and those required to be retested among the "failure" articles, and others. Even if the number of classifiable categories is up to eight, the unloader section 400 in the illustrated example is capable of accommodating only four general-purpose trays KST. For this reason, if there occur some among the tested ICs which should be classified into a category other than categories assigned to the general-purpose trays KST arranged in the unloader section 400, the procedures taken are to return one of the general-purpose trays KST from the unloader section 400 to the IC storage section 200 and in replacement to transfer a general-purpose tray KST for storing the ICs belonging to the new additional category from the IC storage section 200 to the unloader section 400 where those ICs are stored in the new tray.

Referring to FIG. 10, a tray transfer means 205 is disposed above the IC storage rack 201 and the tested IC storage racks 202 for movement over the entire extent of the storage racks 201 and 202 in the direction of arrangement of the racks (in the right to left direction of the testing apparatus) relative to the base plate 105. The tray transfer means 205 is provided on its bottom with grasp means for grasping a general-purpose tray KST. The tray transfer means 205 is moved to a position over the IC storage rack 201 whereupon the elevator 204 is actuated to lift the general-purpose trays KST stacked in the IC storage rack 201, so that the uppermost general-purpose tray KST may be picked up by the grasp means of the tray transfer means 205. Once the uppermost general-purpose tray KST loaded with ICs to be tested has been transferred to the tray transfer means 205, the elevator 204 is lowered to its original position. The tray transfer means 205 is then horizontally moved to and stopped at a predetermined position in the loader section 300 where the grasp means of the tray transfer means 205 is released to allow the general-purpose tray KST to drop into an immediately underlying tray receiver (not shown). The tray transfer means 205 from which the general-purpose tray KST has been unloaded is moved out of the loader section 300. Then, the elevator 204 is moved upward from below the tray receiver having the general-purpose tray KST deposited thereon to lift up the tray receiver and hence the general-purpose tray KST loaded with ICs to be tested so that the general-purpose tray KST is kept exposed up through a window 106 formed in the base plate 105.

The base plate 105 is formed in the area overlying the unloader section 400 with another two similar windows 106 through which empty general-purpose trays are kept exposed. In this example, each of the windows 106 is sized to expose two general-purpose trays therethrough. Hence, four empty general-purpose trays are kept exposed up through two windows 106. Tested ICs are sorted out and stored in these empty general-purpose trays KST according to the categories assigned to respective trays. As with the loader section 300, the four empty general-purpose trays KST are placed on the respective tray receivers which are moved up and down by the associated elevators 204. Once one general-purpose tray KST has been fully filled, the tray is lowered from the level of the window 16 by the elevator 204 and stored in the tray storage position assigned to said tray by the tray transfer means 205. Indicated by the numeral 206 in FIGS. 9 and 10 is an empty tray storage rack for accommodating empty general-purpose trays KST. From this empty tray storage rack 206, empty general-purpose trays are transported to the respective windows 106 by the tray transfer means 205 and the elevators 204 and held thereat by the associated elevators 204 to be ready for receiving tested Ics.

As described above, in an IC testing apparatus having a handler of the foregoing horizontal transporting system mounted thereto in which ICs to be tested are transferred onto a test tray and transported to the test section (chamber section) to perform a test, in transferring the tested ICs from a test tray TST onto a general-purpose tray KST in the unloader section 400, the X and Y direction transfer means 404 stores in a storage device the facts that the tested ICs on the test tray have been transferred onto general-purpose trays by storing the addresses assigned to the respective IC carriers 16 on the associated test tray TST, and it performs the transfer operation of the tested ICs onto general-purpose trays on the basis of the stored addresses so as not to remain any tested IC or ICs which have failed to transfer on the test tray TST. However, there is a rare case that the tested IC or ICs remain on the test tray without being transferred therefrom.

If one or more tested ICs should not have been transferred and have remained on the test tray TST in the unloader section 400, the test tray TST loaded with one or more ICs not transferred is transported to the loader section 300, and hence an IC or ICs to be tested are loaded on the remaining tested IC or ICs in the form of a stack. In such case, the IC to be tested positioned at the upper side of the stack protrudes upwardly from the upper surface of the test tray. Therefore, there occurs a disadvantage that when the test tray loaded with the stack or stacks each of two ICs is transported to the constant temperature chamber 101 and then the subsequent test tray is stacked on the test tray with the stack or stacks of two ICs in the constant temperature chamber 101, the IC to be tested positioned at the upper side of the stack and protruding upwardly is pushed out of the associated test tray by insertion of the subsequent test tray and dropped down therefrom or an accident such as breakage of the IC to be tested may happen.

If an accident occurs that an IC drops down out of the associated test tray TST in the constant temperature chamber 101, it may occur that the IC drops down on a carrying mechanism or the like provided on the lower side of the constant temperature chamber 101 and interferes therewith so that the carrying mechanism can fail to convey. In addition, if the IC to be tested as being stacked on the remaining tested IC should be tested and transported to the unloader section 400 without dropping out of the test tray, the upper IC in the stack is sorted out on the basis of the test results of the lower remaining tested IC in the stack, and hence there is a disadvantage that an erroneous classification is done.

Similarly, the above-mentioned problems also will occur in case that an IC testing apparatus uses a handler of the type which can be used in common in transferring ICs accommodated in a square-shaped pipe-like IC container which is of substantially rectangular shape in section called a "rodlike magazine" and ICs loaded on a general-purpose tray onto a test tray and transporting the test tray loaded with the ICs thereon to the test section for testing, followed by various processings of the tested ICs on the basis of the data of the test results (for example, refer to Japanese Patent Application No. 171911/1994).

SUMMARY OF THE INVENTION

It is therefore a first object of the present invention to provide an IC testing apparatus which is able to prevent from occurring an accident that one or more tested ICs are left on a test tray without being transferred therefrom.

A second object of the present invention is to provide an IC testing apparatus which is capable of detecting that one or more ICs have been dropped out from the associated test tray loaded with ICs thereon.

According to a first aspect of the present invention, there is provided an IC testing apparatus which is arranged such that ICs to be tested are transferred from a general-purpose tray to a test tray to be reloaded thereon in a loader section, and the test tray loaded with the ICs is transported into a test section where the ICs undergo a test, after the completion of the test, the test tray loaded with the tested ICs is transported from the test section to an unloader section where the tested ICs on the test tray are transferred from the associated test tray onto a general-purpose tray, and the test tray which has been emptied of the tested ICs is transported from the unloader section to the loader section where new ICs to be tested are loaded on the emptied test tray for successively testing ICs, and comprises an IC detecting sensor for detecting whether an IC exists on the test tray being transported or not, the IC detecting sensor being provided between the unloader section and the loader section so that the presence of any IC having been left on the test tray can be detected.

According to a second aspect of the present invention, there is provided an IC testing apparatus which is arranged such that ICs to be tested are transferred from a general-purpose tray to a test tray to be reloaded thereon in a loader section, and the test tray loaded with the ICs is transported into a test section where the ICs undergo a test, after the completion of the test, the test tray loaded with the tested ICs is transported from the test section to an unloader section where the tested ICs on the test tray are transferred from the associated test tray onto a general-purpose tray, and the test tray which has been emptied of the tested ICs is transported from the unloader section to the loader section where new ICs to be tested are loaded on the emptied test tray for successively testing ICs, and comprises an IC detecting sensor for detecting whether an emptied IC receiving portion having no IC therein exists in the test tray or not, the IC detecting sensor being provided on the way of the carrying path of the test tray transported from the test section toward the unloader section.

According to a third aspect of the present invention, there is provided an IC testing apparatus which is arranged such that ICs to be tested are transferred from a general-purpose tray to a test tray to be reloaded thereon in a loader section, and the test tray loaded with the ICs is transported into a test section where the ICs undergo a test, after the completion of the test, the test tray loaded with the tested ICs is transported from the test section to an unloader section where the tested ICs on the test tray are transferred from the associated test tray onto a general-purpose tray, and the test tray which has been emptied of the tested ICs is transported from the unloader section to the loader section where new ICs to be tested are loaded on the emptied test tray for successively testing ICs, and comprises an IC detecting sensor for detecting whether an emptied IC receiving portion having no IC therein exists in the test tray or not, the IC detecting sensor being provided on the way of the carrying path of the test tray transported from the loader section toward the test section.

In the IC testing apparatus of the first aspect of the invention, even if an IC should have been left on the test tray being transported from the unloader section toward the loader section, the presence of that IC remaining on the test tray can be detected, and hence, when the test tray arrives at the loader section, the remaining IC on the test tray can be removed from the test tray. As a result, there occurs no accident that two ICs are stacked one on another and the upper side IC of the stack is dropped down on the bottom of the constant temperature chamber. Accordingly, an IC testing apparatus having high safety can be provided.

In the IC testing apparatus of the second aspect of the invention, even if any tested IC should drop down out of the test tray in the test section, the position of the IC receiving portion of the test tray from which the IC has been dropped down can be detected during the transportation time of the test tray from the test section to the unloader section. Therefore, it is possible in the unloader section to stop a classifying operation for the IC receiving portion where no IC exists, and consequently the above-described disadvantage that an erroneous classification is done can be eliminated.

In the IC testing apparatus of the third aspect of the invention, even if any IC should drop down out of the test tray during the transportation time of the test tray from the loader section to the test section, the emptied IC receiving portion of the test tray from which the IC has been dropped down can be detected until the test tray arrives at the test section. Therefore, it is possible in the test section to stop a testing operation for the IC receiving portion where no IC exists and hence the time required for the testing operation can be reduced since no waste of time is expended.

DESCRIPTION OF THE PREFERRED EMBODIMENTS

Figure 1:
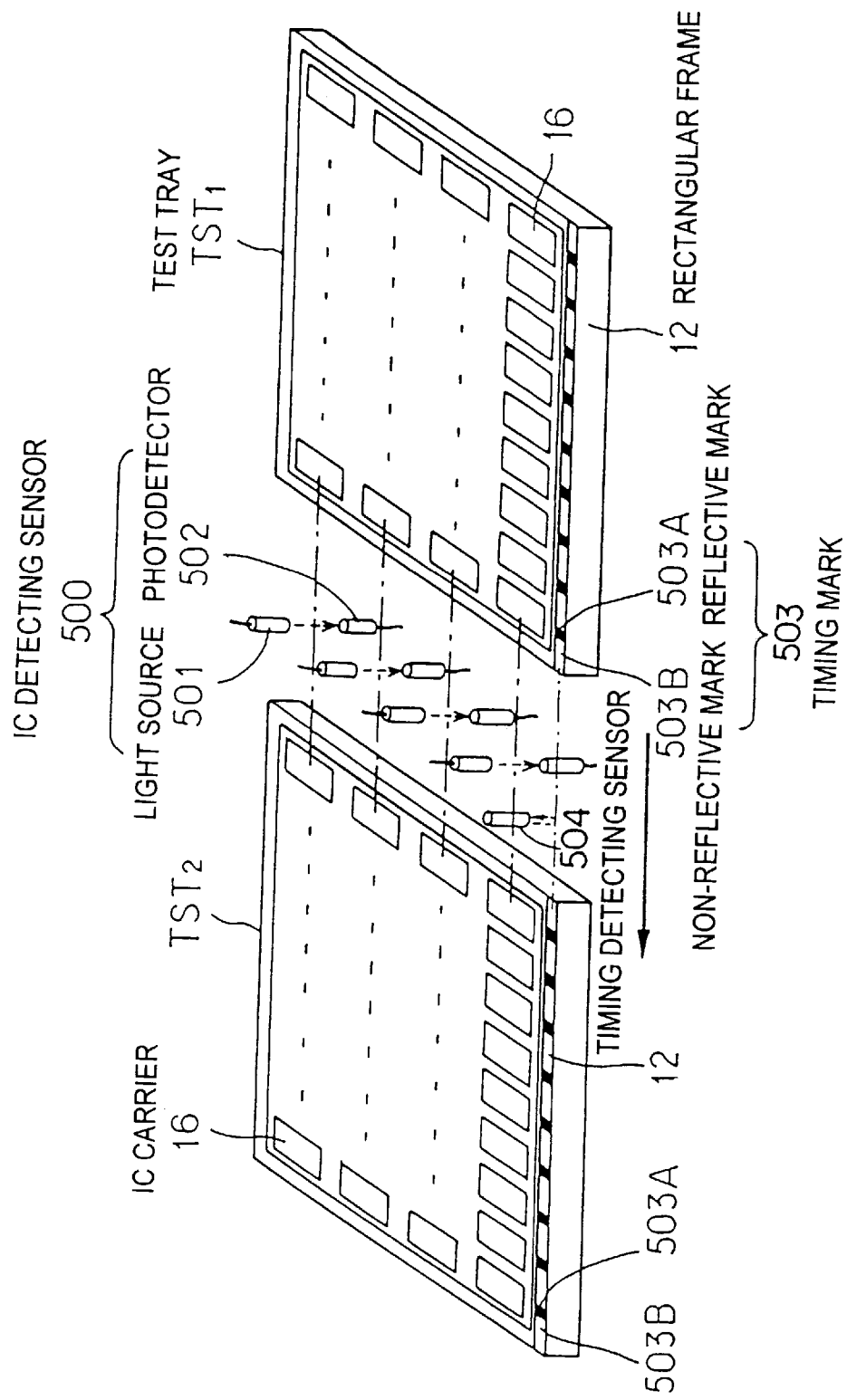
FIG. 1 is a perspective view showing a construction of the main portion of an embodiment of the semiconductor device testing apparatus according to the present invention.
Figure 10:
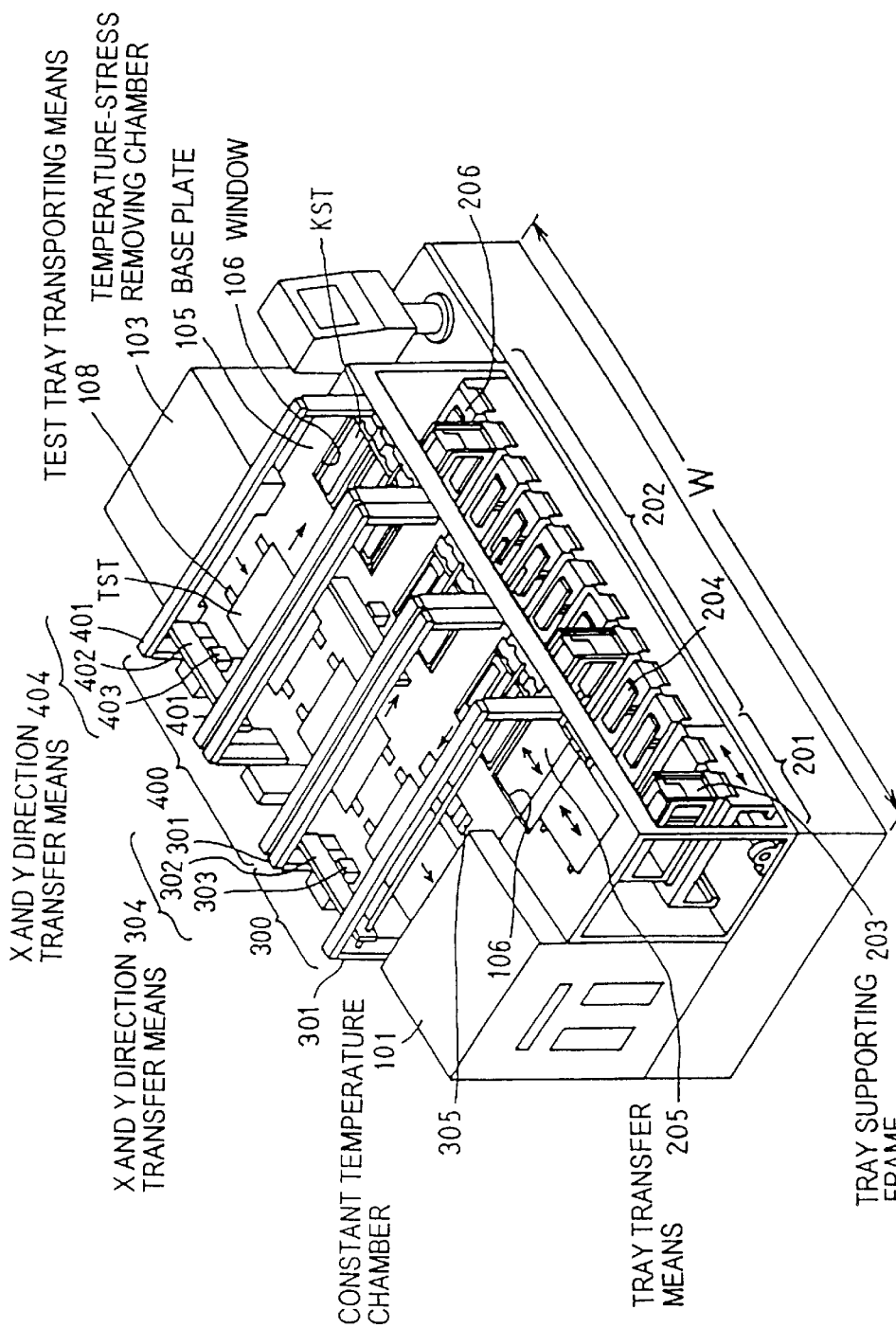
FIG. 10 is a perspective view of the conventional IC testing apparatus shown in FIG. 9.
Figure 11:
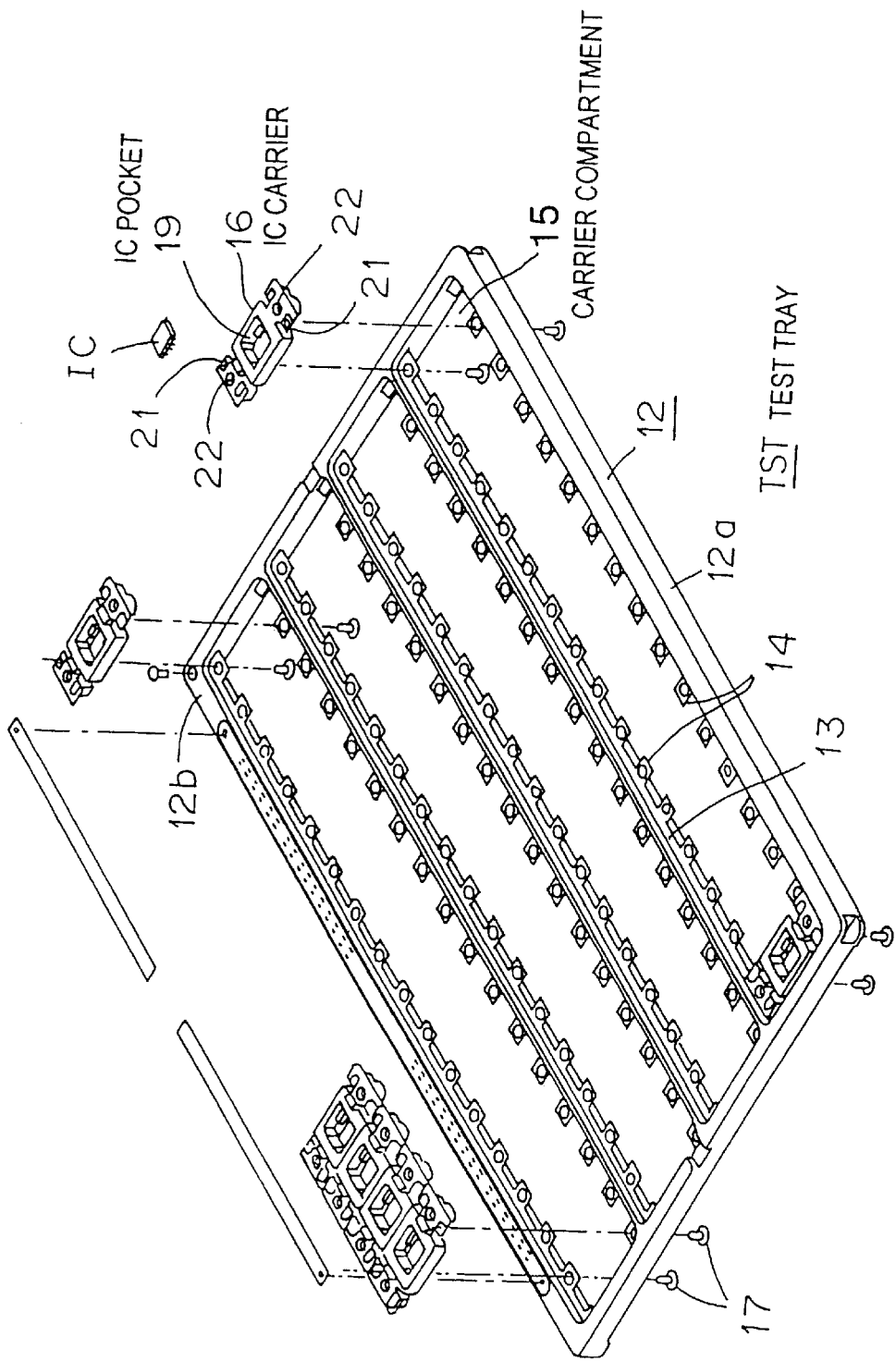
FIG. 11 is an exploded perspective view explaining the structure of an example of a test tray for use in the IC testing apparatus.
Figure 12:
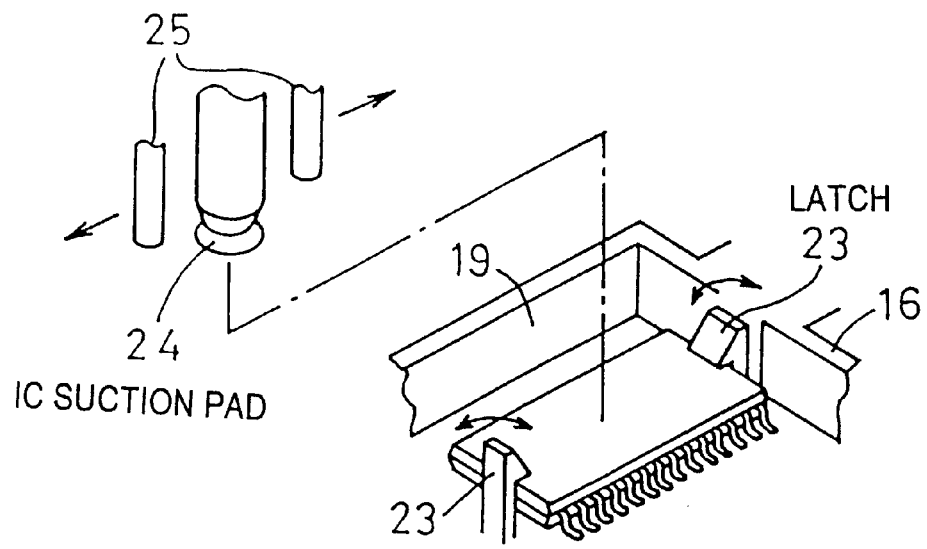
FIG. 12 is a perspective view explaining how ICs are loaded on the test tray depicted in FIG. 11.
Figure 13:
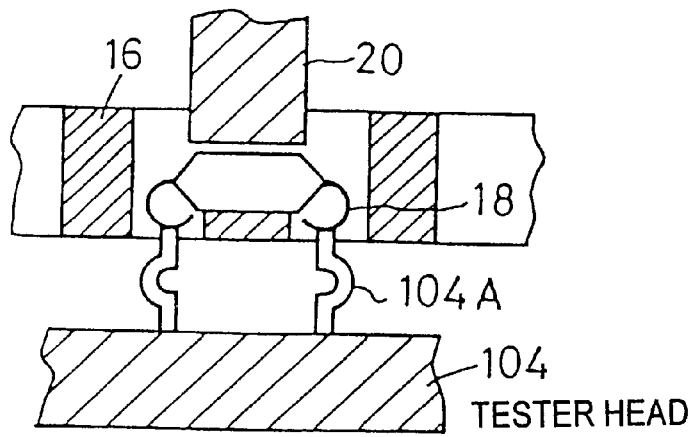
FIG. 13 is an enlarged sectional view illustrating an electrical connection between an IC loaded on the test tray shown in FIG. 6 and a tester head.

FIG. 1 shows an embodiment of the IC testing apparatus according to the present invention. This IC testing apparatus has a handler of the horizontal transporting system mounted thereto as described above with reference to FIGS. 9 to 12, and comprises a tester part (principally the lower base portion in FIG. 10) which is an electrical portion of the IC testing apparatus for measuring the electrical characteristics of ICs under test by applying test signals of a predetermined pattern to the ICs, and a handler part (principally the upper mechanical portion in FIG. 10). As with the conventional IC testing apparatus described above, the handler part comprises a chamber section for testing ICs which have been carried on a test tray, an IC storage section for storing ICs to be tested and ICs already tested and sorted out, a loader section where ICs to be tested which a user has beforehand loaded on general-purpose trays are transferred and reloaded onto a test tray capable of withstanding high/low temperatures, and an unloader section where the tested ICs which have been carried on the test tray out of the chamber section subsequently to undergoing a test therein are transferred from the test tray to the general-purpose trays to be reloaded on the latter. The chamber section comprises a constant temperature chamber for imposing a temperature stress of either a designed high or low temperature on ICs to be tested loaded on a test tray, a test chamber for conducting electrical tests on the ICs under the temperature stress imposed in the constant temperature chamber by bringing the ICs into electrical contact with a tester head of the tester part, and a temperature-stress removing chamber for removing the temperature stress imposed in the constant temperature chamber from the ICs having undergone the tests in the test chamber.

FIG. 1 is an illustration for explaining the construction of an essential portion of this embodiment wherein a test tray $TST_1$ being stopped at an unloader section 400 of the handler part, a test tray $TST_2$ being stopped at a loader section 300, and an IC detecting sensor 500 provided between the unloader section 400 and the loader section 300 are shown. This IC detecting sensor 500 serves to detect whether or not an IC is left on each of the IC carriers 16 (see FIG. 11) mounted to the test tray TST.

In this embodiment, there is shown a case in which a plurality of light transmission type IC detecting sensors 500 each comprising a light source 501 and a photodetector 502 are disposed between the unloader section 400 and the loader section 300 such that the light source 501 and the photodetector 502 of each sensor 500 are opposed to each other with a plane through which a test tray TST passes put therebetween, and aligned in the direction orthogonal to the moving direction of the test tray TST, thereby to detect whether or not an IC is left on the test tray TST passing through the plane.

The IC detecting sensor 500 is provided corresponding to the number of lines (the number of transverse rows along the moving direction of the test tray) of the IC carriers 16 mounted to the test tray TST. That is, when the number of carriers 16 mounted to the test tray TST aligned in the direction orthogonal to the moving direction of the test tray TST (in the direction of a longitudinal row) is four (the number of lines is four) as shown, four IC detecting sensors 500 may be arranged at a pitch that is an interval between the four IC carriers 16 aligned in the direction of the longitudinal row. In the illustrated example, the light sources 501 are provided on the upper side of the plane through which the test tray passes, and the photodetectors 502 are provided on the lower side of the plane through which the test tray passes. The light sources 501 and the photodetectors 502 may be, of course, arranged in the reverse relation.

Figure 2:
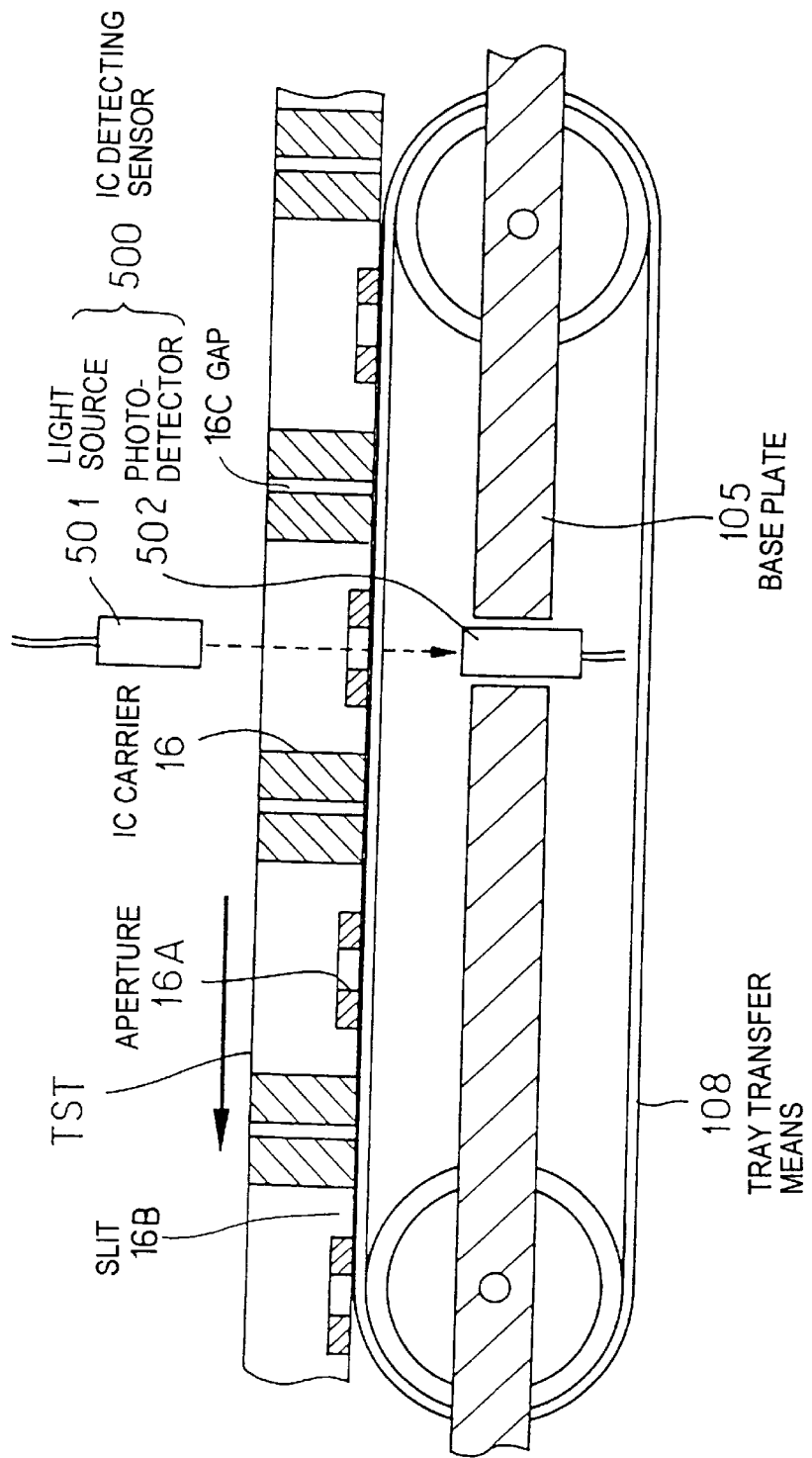
FIG. 2 is a generally sectional view of FIG. 1.
Figure 3:
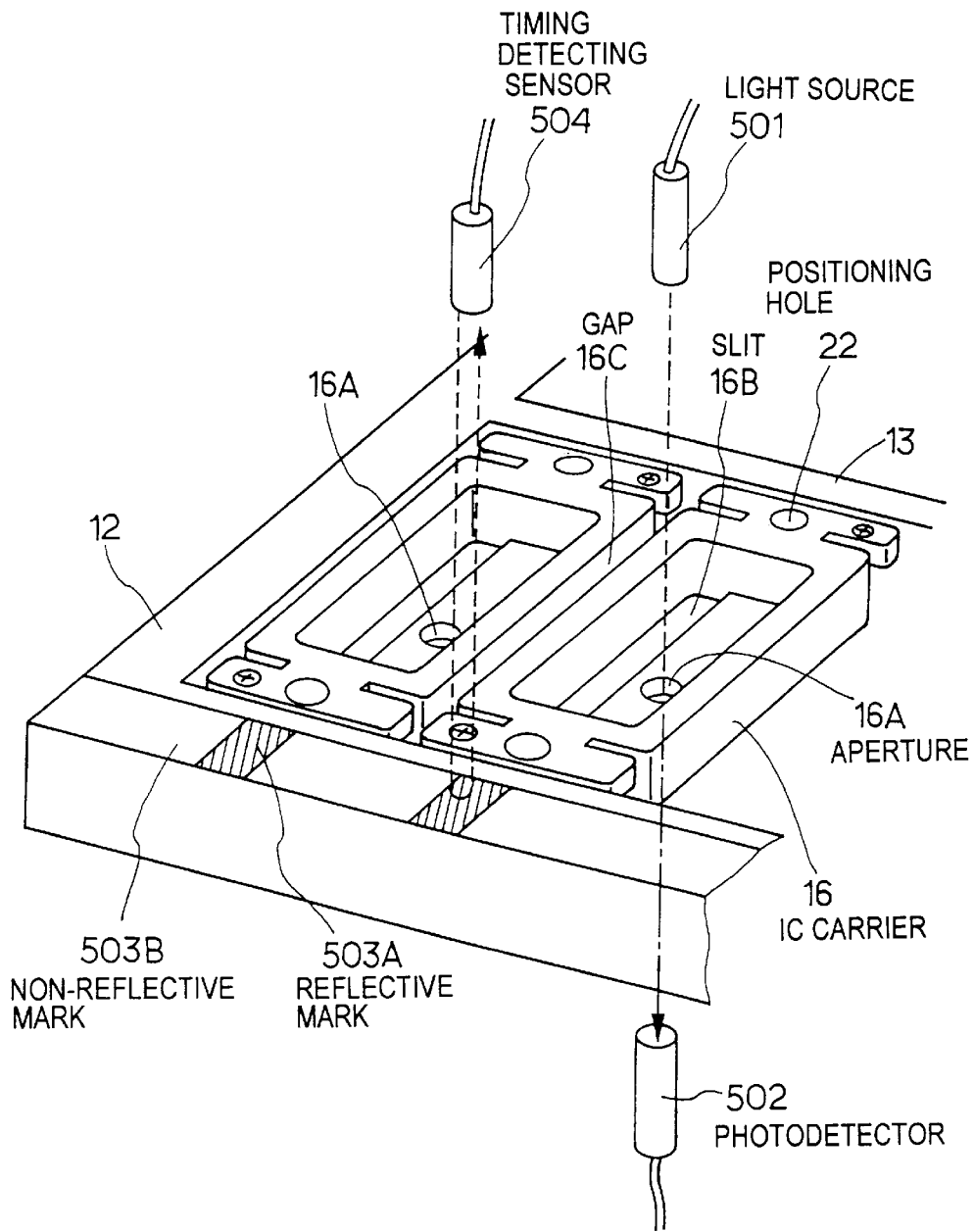
FIG. 3 is an enlarged perspective view showing a portion of the semiconductor device testing apparatus shown in FIG. 1.

An aperture (through-hole) 16A is formed in a base plate of each IC carrier 16 as shown in FIGS. 2 and 3. The photodetector 502 detects light passing through the aperture 16A. Since there is an opening through which light from the light source 501 passes (an opening through which pins of an IC loaded on the IC carrier 16 are exposed or the like) in the base plate of each IC carrier 16, only the light passing through the aperture 16A must be detected by the photodetector 502. For this purpose, as illustrated in FIG. 3 in enlarged size, this embodiment is arranged such that timing marks 503 are disposed at predetermined intervals relating to the moving direction of the test tray TST on one of the sides of the rectangular frame 12 of the test tray TST running parallel to the moving direction of the test tray TST, and that a timing detecting sensor 504 detects light reflected from each of the timing marks 503.

The timing marks 503 comprise, illustrated example, reflective marks 503A and non-reflective marks 503B existing between the reflective marks 503A, the reflective marks 503A being applied to positions of the one side of the rectangular frame 12 corresponding to the positions of the apertures 16A of the base plates of a set of the IC carriers 16 aligned in the moving direction of the test tray. In this embodiment, the rectangular frame 12 of each test tray is made of a non-reflective material, and hence portions of the rectangular frame 12 on which the reflective marks 503A are not affixed do not reflect light. Consequently, it is unnecessary in this example to apply separate non-reflective marks 503B on the one side of the rectangular frame 12 of the test tray running parallel to the moving direction of the test tray. If the rectangular frame 12 of each test tray is made of a reflective material, non-reflective marks 503B may be applied to on the one side of the rectangular frame 12 of the test tray running parallel to the moving direction of the test tray.

Each of the reflective marks 503A has its size or length in the moving direction selected to be equal to or a little longer than the diameter of corresponding one of the apertures 16A of the base plates of a set of the IC carriers 16 aligned in the moving direction of the test tray. Accordingly, the timing detecting sensor 504 is located above the plane through which the test tray passes and detects light emitted from the timing detecting sensor 504 and reflected from one of the reflective marks 503A. With the construction as described above, only the light passing through the aperture 16A can be detected thereby detecting the presence of an IC on the test tray depending upon whether the IC detecting sensor 500 detects light or not while the timing detecting sensor 504 is detecting light reflected from one of the reflective marks 503A, that is, with a timing that the timing detecting sensor 504 is detecting light reflected from one of the reflective marks 503A.

In the aforementioned embodiment, there is explained a case of detecting whether or not an IC remains on a test tray transported from the unloader section 400 to the loader section 300. However, an alternative arrangement is also possible in which IC detecting sensors 500 are positioned, for example, midway on the path from the loader section 300 to the tester head 104 as well as midway on the path from the tester head 104 to the unloader section 400. With such arrangement, it is possible to detect an empty IC pocket in a test tray resulting from that an IC is dropped out of the test tray while the test tray is transporting from the loader section 300 to the tester head 104 can be detected. Also, it is possible to detect an empty IC pocket in the test tray resulting from that an IC is dropped out of the test tray during the test on the tester head 104.

It is possible to improve the reliability of the IC testing apparatus by providing the IC detecting sensors 500 at any one of the positions as stated above. However, in case the IC detecting sensors 500 are provided at both positions between the unloader section 400 and the loader section 300 and between the tester head 104 and the unloader section 400, or at both positions between the unloader section 400 and the loader section 300 and between the loader section 300 and the tester head 104, the reliability of the IC testing apparatus can be further improved. It is needless to say that if the IC detecting sensors 500 are provided at all the above positions, the reliability of the IC testing apparatus can be improved most.

Further, the relationship of disposition between the reflective marks 503A and the non-reflective marks 503B may be reversed from the state shown in FIG. 3 so that only the light passing through the aperture 16A can be detected thereby detecting the presence of an IC on the test tray depending upon whether the IC detecting sensor 500 detects light or not with a timing that the timing detecting sensor 504 is not detecting any reflected light.

In addition to the light transmission type IC detecting sensor, a proximity switch for detecting a metal (a metal in an IC) or a camera having a pattern recognition function or the like may be used as the IC detecting sensor 500.

The present invention can also be applied to an IC testing apparatus using a magazine/tray type handler which can be used in common in transferring ICs accommodated in a "rod-like magazine" and ICs loaded on a general-purpose tray onto a test tray. ICs accommodated in a rod-like magazine are successively slid down by their own weights, that is, ICs are discharged out of the magazine by the natural dropping force of each IC by its own weight by supporting the rod-like magazine in an inclined state from its horizontal state. Therefore, if a station where ICs discharged out of the magazine are transferred onto a test tray is defined as a loader section, as with the above-discussed embodiment, it is possible to improve the reliability of the IC testing apparatus having such magazine/tray type handler mounted thereto by providing the IC detecting sensors 500 at any one or two of the positions on the way of the carrying path of the test tray between the unloader section 400 and this loader section, on the way of the carrying path of the test tray between this loader section and the tester head 104, and on the way of the carrying path of the test tray between the tester head 104 and the unloader section 400. It is needless to say that if the IC detecting sensors 500 are provided at all the above positions, the reliability of the IC testing apparatus can be improved most.

Figure 4:
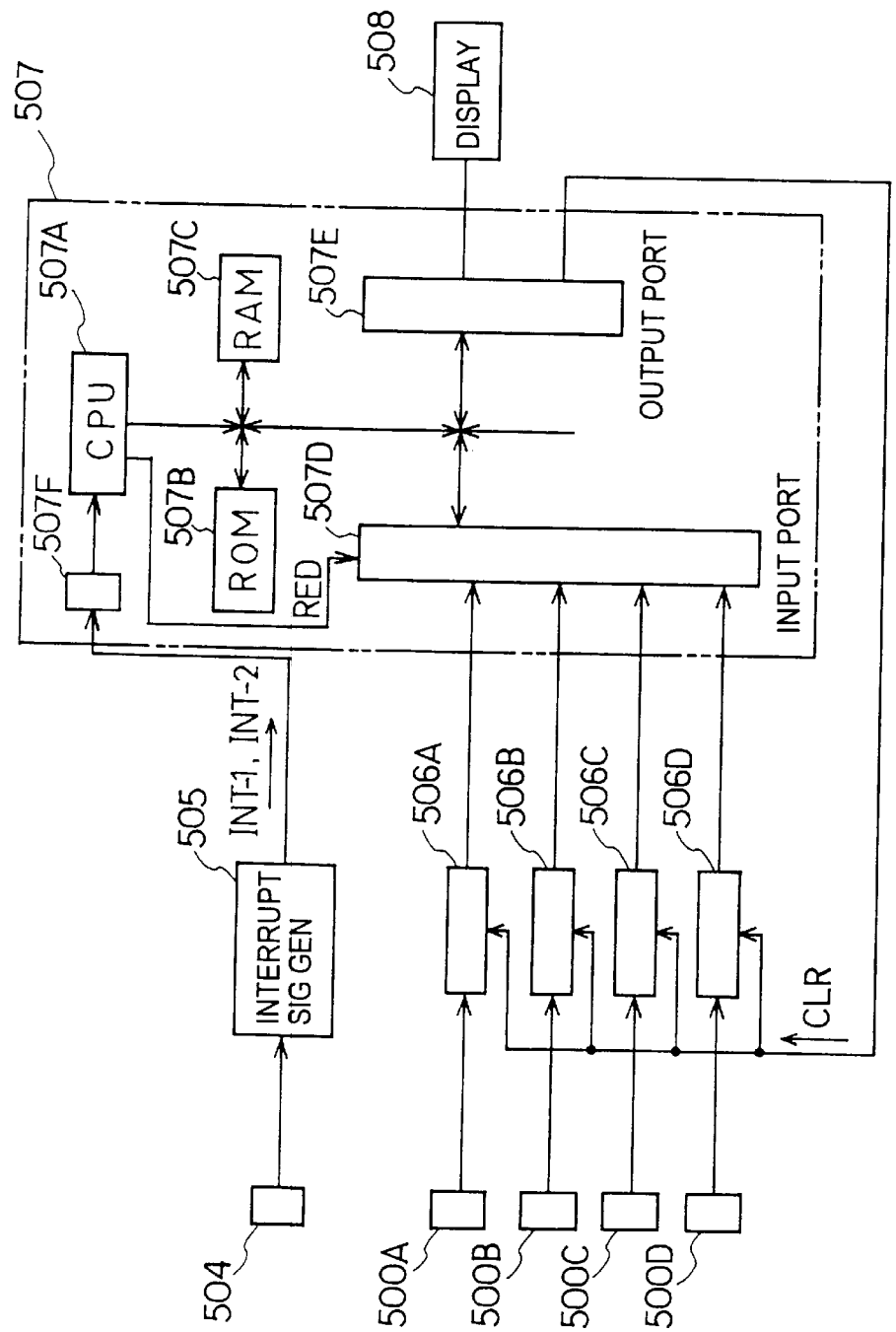
FIG. 4 is a block diagram showing an example of an IC detecting circuit for use in an IC detecting method used in the semiconductor device testing apparatus according to the present invention.

FIG. 4 shows an example of the arrangement or construction of the IC detecting sensor 500 and the related circuit which detects whether or not an IC exists. As shown in FIG. 1, four IC detecting sensors 500 are provided in this embodiment, and these four IC detecting sensors are indicated as 500A–500D in FIG. 4. The following description will be discussed assuming that the IC detecting sensors 500A–500D output L logic signal (low logic level signal) when light passes through the corresponding aperture (when the photodetector 501 receives light from the light source 501) and the timing detecting sensor 504 detecting the position of an IC existing on a test tray outputs L logic signal when it receives a reflected light.

Figure 5:
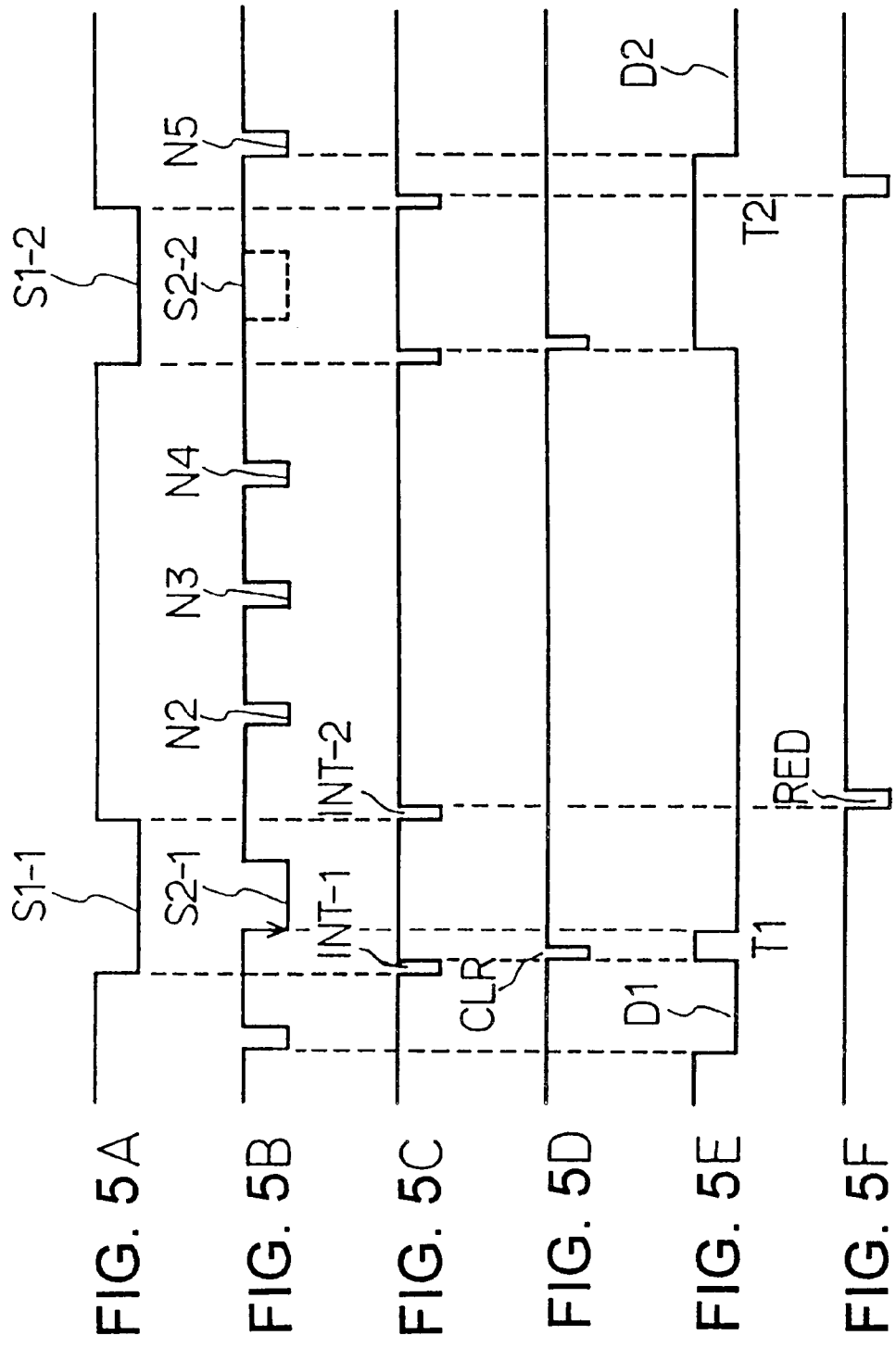
FIGS. 5A–5F illustrate waveforms for explaining the operation of the IC detecting circuit shown in FIG. 4.

As shown in FIG. 5, the timing detecting sensor 504 outputs H logic signal (high logic level signal) when it does not detect the reflective mark 503A applied to the rectangular frame 12, and outputs L logic signal when it detects the reflective mark 503A. As a result, the sensor 504 outputs L logic signals S1-1, S1-2, ... (FIG. 5A) every time it detects the reflective mark 503A. S1-1 indicates a signal outputted from the sensor 504 on detecting the first reflective mark, S1-2 indicates a signal outputted from the sensor 504 on detecting the second reflective mark. Each of the IC detecting sensors 500A–500D receives light passing through the aperture 16A formed in the IC carrier 16A at about the central position of the reflective mark 503A and outputs a signal S2-1, S2-2, ... (FIG. 5B) falling down to L logic and remaining L logic during the aperture 16A exists. In the waveform illustrated in FIG. 5B, S2-1 is L logic signal and hence is the signal detected by the IC detecting sensor when there is no IC. S2-2 is H logic signal and hence is the signal detected by the IC detecting sensor when an IC exists. Further, as is seen from FIGS. 2 and 3, L logic signals N1, N2, N3, N4, and N5 other than the detected signals S2-1 and S2-2 are the detected signals of the IC detecting sensor generated by lights passing through slits 16B formed in the IC carrier 16 and a gap 16C formed between adjacent two IC carriers 16, respectively.

The detected signals S1-1, S1-2, ... of the timing detecting sensor 504 are supplied to an interrupt signal generating circuit 505 which generates interrupt signals INT-1 and INT-2 (FIG. 5C) with timings of fall and rise of each of the detected signals S1-1, S1-2, ..., respectively. These interrupt signals INT-1, INT-2 are supplied to a controller 507 which starts the interrupt operation by the interrupt signal INT-1 generated with a timing of fall of the detected signal and ends the interrupt operation by the interrupt signal INT-2 generated with a timing of rise of the detected signal.

The controller 507 may be constituted, for instance, by a microcomputer. The microcomputer comprises, as is well known, a central processing unit 507A generally called CPU, a ROM (read only memory) 507B in which programs or the like are stored, a RAM (random access memory) 507C for temporarily storing data or the like read in the controller, an input port 507D, an output port 507E, an interrupt input port 507F, and the like. The interrupt signals INT-1 and INT-2 are read in the central processing unit 507A through the interrupt input port 507F thereby causing the central processing unit 507A to execute an interrupt operation. The central processing unit 507A outputs a clear signal CLR shown in FIG. 5D through the output port 507E every time it starts an interrupt operation. The clear signal CLR is supplied to latch circuits 506A–506D which latch the detected signals of the four IC detecting sensors 500A–500D respectively to clear (reset) the states of the latch circuits 506A–506D. The outputs of the latch circuits 506A–506D are inverted to H logic level by clear thereof as shown in FIG. 5E. To the latch circuit 506A is inputted the signals S2-1, S2-2, ... generated due to the aperture 16A detected by the IC detecting sensor 500A and the signals N1, N2, N3, N4, and N5 generated due to the slits 16B, etc. As with the latch circuit 506A, other latch circuits 506B–506D have the signals generated due to the apertures 16A detected by the IC detecting sensors 500B–500D and the signals generated due to the slits 16B, etc., inputted thereto, respectively.

The outputs of the latch circuits 506A–506D change from H logic level to L logic level when the detected signals of the corresponding IC detecting sensors 500A–500D fall to L logic level in the state that the latch circuits 506A–506D have latched H logic level. Therefore, when the timing detecting sensor 504 detects the reflective mark 503A and the outputs of the IC detecting sensors 500A–500D fall to L logic level immediately after all the latch circuits 506A–506D are cleared at the start of the interrupt, each of the latch circuits 506A–506D inverts its latched output to L logic level. The time point T1 shown in FIG. 5E indicates this event.

When the reflective mark 503A passes by the position at which the timing detecting sensor 504 is located, the interrupt operation ends. At this time, the central processing unit 507A generates a read command signal RED shown in FIG. 5F, thereby to read the latched outputs of the latch circuits 506A–506D in the RAM 507C through the input port 507D. If the read-in results are L logic level, it is known that an IC does not exist in the IC carrier 16. On the other hand, if an IC exists in the IC carrier 16, the latched output of the latch circuit 500A is held in H logic level as shown in FIG. 5E at and after the time point T2, the controller 507 reads H logic level in the RAM 507C regarding the latch circuit 506A, in the illustrated example, after the time point T2, for instance. With the H logic level read in the RAM 507C, the central processing unit 507A detects presence of an IC and displays on a display 508 an indication that an IC exists, for instance. The display 508 is so arranged that it can display separately the outputs of the latch circuits 506A–506D. In addition, the display 508 can specifically indicate the position of an IC carrier 16 on the test tray TST by counting the number of the reflective marks 503A.

As described above, the IC detecting sensors 500A–500D detect transmitted light through a place in the IC carrier 16 other than the aperture 16A formed in the IC carrier 16, respectively. That is, in addition to the aperture 16A, there exist the slits 16B in each IC carrier 16, and also the gap 16C between adjacent two IC carriers 16. Accordingly, if noise signals N1, N2, N3, N4, and N5 have occurred by these slits 16B and the gap 16c as shown in FIG. 5B, it is seen that the noise signals N1 and N5 have been produced in the state that the latch circuit 506A has been latching H logic level in the waveform illustrated in FIG. 5. In such case, the latched content of the latch circuit 506A would be rewritten to L logic level by the noise signals N1 and N5. However, the erroneous data in the latch circuit 506A would be eliminated because when the next reflective mark 503A arrives at the IC detecting sensors, each of the latch circuits are cleared by a clear signal CLR generated thereby. Thus, even if the noise signals N1–N5 should be produced, the controller 507 does not read the erroneous data therein.

In the above embodiment, the operation of the controller 507 is described on the assumption that the state in which the latch circuits 506A–506D latch L logic level respectively is normal. This logical state can be applied to a case of detecting whether an IC exists or not on a test tray which is transported to the loader section 300 from the unloader section 400 and has the IC carriers 16 mounted thereto which ought to be emptied of ICs. On the other hand, it may be also possible to make the controller 507 determine that the state in which the latch circuits 506A–506D latch H logic level respectively is normal. This logical state can be applied to a case of detecting whether an IC drops down out of a test tray or not during the time duration from after ICs are transferred onto the test tray in the loader section 300 until the test tray is discharged to the unloader section 400.

Therefore, the IC detecting method described with reference to FIG. 4 can be utilized in detecting both the presence of an IC and the absence of an IC.

Further, the embodiment described above has been discussed by giving one example in which the timing mark 503 composed of the reflective marks 503A and the non-reflective marks 503B are used as a timing mark for detecting the position on the test tray of an IC carrier 16 (the position of the aperture 16 formed in an IC carrier 16). It is also possible instead of the reflective marks 503A and the non-reflective marks 503B to utilize slits (through-holes or apertures) formed in the rectangular frame 12 at predetermined intervals relative to the moving direction of the test tray and to specify by the slits the positions of the apertures 16A formed in a set of IC carriers 16 aligned in the moving direction of the test tray. In such case, the timing detecting sensor may be configured such that it detects the positions of the slits by detecting lights passing through the slits, or not receiving reflected light from each slit in case the test tray is constructed such that light is reflected from the portions other than the slits.

Figure 6:
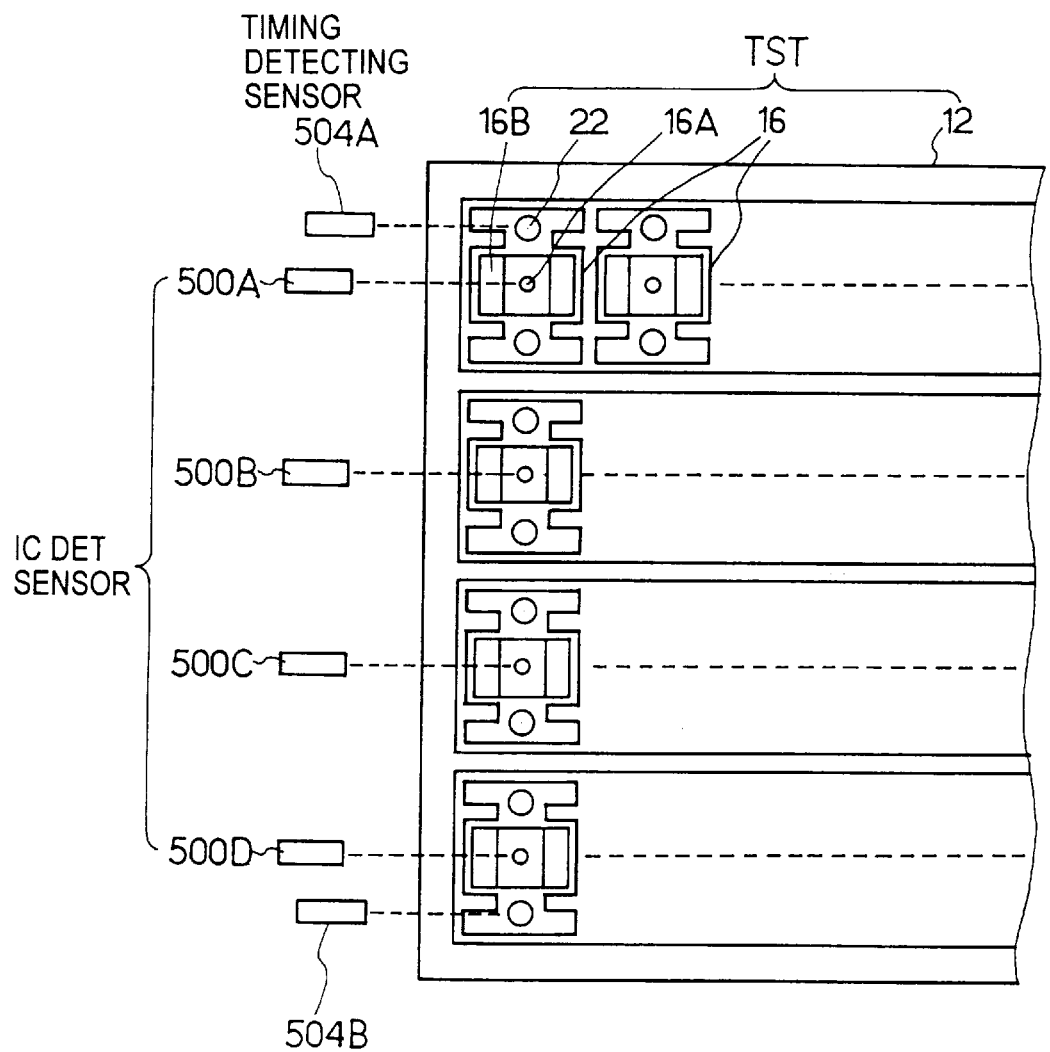
FIG. 6 is a plan view for explaining another example of the IC detecting method used in the semiconductor device testing apparatus according to the present invention.

FIG. 6 shows another example of the timing mark detecting method. In this example, a case in which the holes 22 formed in each IC carrier 16 are used as a timing mark in place of the reflective marks 503A is illustrated. The holes 22 are provided in each IC carrier 16 for insertion of positioning pins thereinto. The holes 22 will be referred to as "positioning holes" hereinafter. Each of the positioning holes 22 are formed at substantially the same positions as those of the apertures 16A relative to the moving direction of the test tray as is understood from FIG. 3, and hence it is possible to specify the positions of the apertures 16A formed in the IC carriers 16 by use of the positioning holes 22 without forming slits (apertures) in the rectangular frame 12 at predetermined intervals relative to the moving direction of the test tray.

The embodiment shown in FIG. 6 is a case in which as a timing mark are utilized the positioning holes 22 which are located in the direction orthogonal to the moving direction of the test tray TST and placed at the outermost positions on the both sides of the central line in the longitudinal direction (moving direction) of the test tray. That is, in this embodiment, since the number of lines of the IC carriers 16 mounted to the test tray (the number of IC carrier arrays aligned in parallel to the moving direction of the test tray) is four, the outer positioning holes 22 among the positioning holes 22 of the IC carriers 16 in both outer IC carrier arrays which are the first and the fourth IC carrier arrays are utilized as a timing mark. Timing detecting sensors 504A and 504B for detecting these outer positioning holes 22 are provided in place at the upper side or under side of the test tray. The timing sensors 504A and 504B detect the positions of the positioning holes 22 by detecting light passing through each of the positioning holes 22. The IC detecting sensors 500A–500D which detect the apertures 16A of each of the IC carrier arrays in parallel to the moving direction of the test tray may be disposed in the same manner as the embodiment described before.

Figure 7:
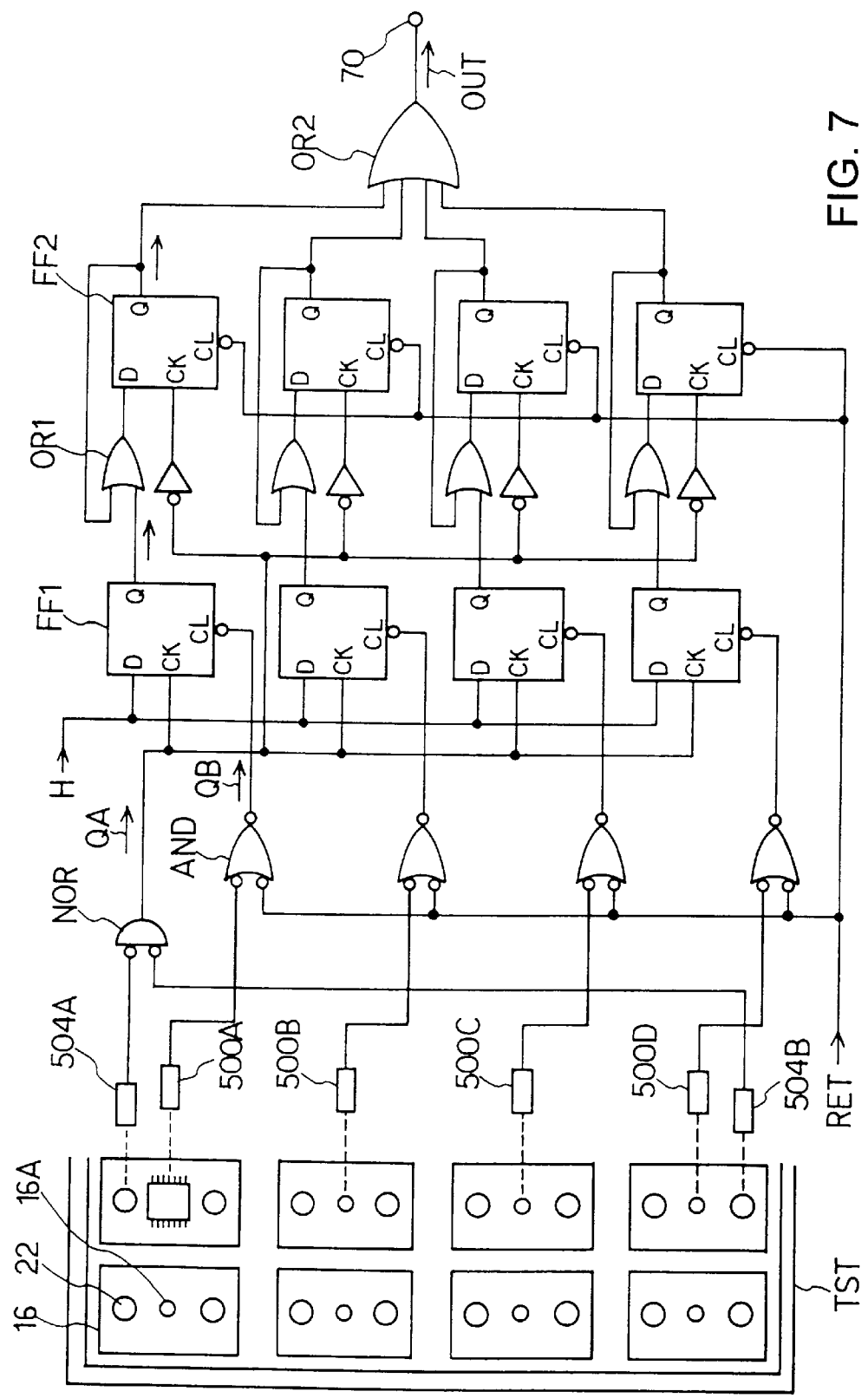
FIG. 7 is a block diagram showing an example of the IC detecting circuit for use in the IC detecting method shown in FIG. 6.

FIG. 7 shows a construction of an IC detecting circuit used in such case. The circuit construction for detecting the apertures 16A of all of the four IC carrier arrays is shown in FIG. 7, but the circuit construction relating to each IC carrier array is the same with one another, and hence the circuit construction relating to the first IC carrier array and the operation thereof will be described hereinafter.

The detecting circuit for detecting the apertures 16A of the IC carriers in the first IC carrier array comprises timing detecting sensors 504A and 504B, a NOR gate NOR for taking out the detected signals outputted from the timing detecting sensors 504A and 504B, an AND gate AND for taking out the detected signal outputted from an IC detecting sensor 500A, a first flip-flop FF1 for storing therein as L logic level signal the fact that the IC detecting sensor 500A has detected transmitted light through the aperture 16A in the state that the timing detecting sensors 504A and 504B have been detecting the positioning holes 22, and as H logic level signal the fact that an IC has existed (the IC detecting sensor 500A has not detected transmitted light through the aperture 16A) in the state that the timing detecting sensors 504A and 504B have been detecting the positioning holes 22, and for outputting the stored content, and a second flip-flop FF2 for taking out, once the first flip-flop FF1 has outputted the H logic level signal by detection of the presence of an IC, this H logic level signal and retaining the H logic level signal therein until the test tray has passed.

The NOR gate NOR outputs a timing signal QA which changes to H logic level each time both the timing detecting sensors 504A and 504B detect the positioning holes 22, as shown in FIG. 8A. Since this timing signal QA is supplied to the clock terminal CK of the first flip-flop FF1, the first flip-flop FF1 reads therein the H logic level being applied to its data terminal D with a timing of rise of the timing signal QA.

If an IC is absent from the IC carrier 16, the IC detecting sensor 500A outputs a signal QB shown in FIG. 8B which falls to L logic level by that the sensor 500A detects transmitted light through the aperture 16A and retains L logic level until the aperture 16A has passed. Since this signal QB is supplied to the clear terminal CL of the first flip-flop FF1, the first flip-flop FF1 is cleared (reset) with a timing of fall of the timing signal QB and stores L logic level therein to output it. The output signal Q1 of the first flip-flop FF1 is shown in FIG. 8C. The output signal Q1 rises to H logic level with a timing T1 of rise of the timing signal QA and returns back to L logic level with a timing T2 of fall of the signal QB.

With a timing of fall of the timing signal QA the second flip-flop FF2 reads therein the logic state of the output of the first flip-flop FF1. In this case, if the output of the first flip-flop FF1 is at L logic level, then the second flip-flop FF2 retains the state of L logic level forever.

Figure 8:
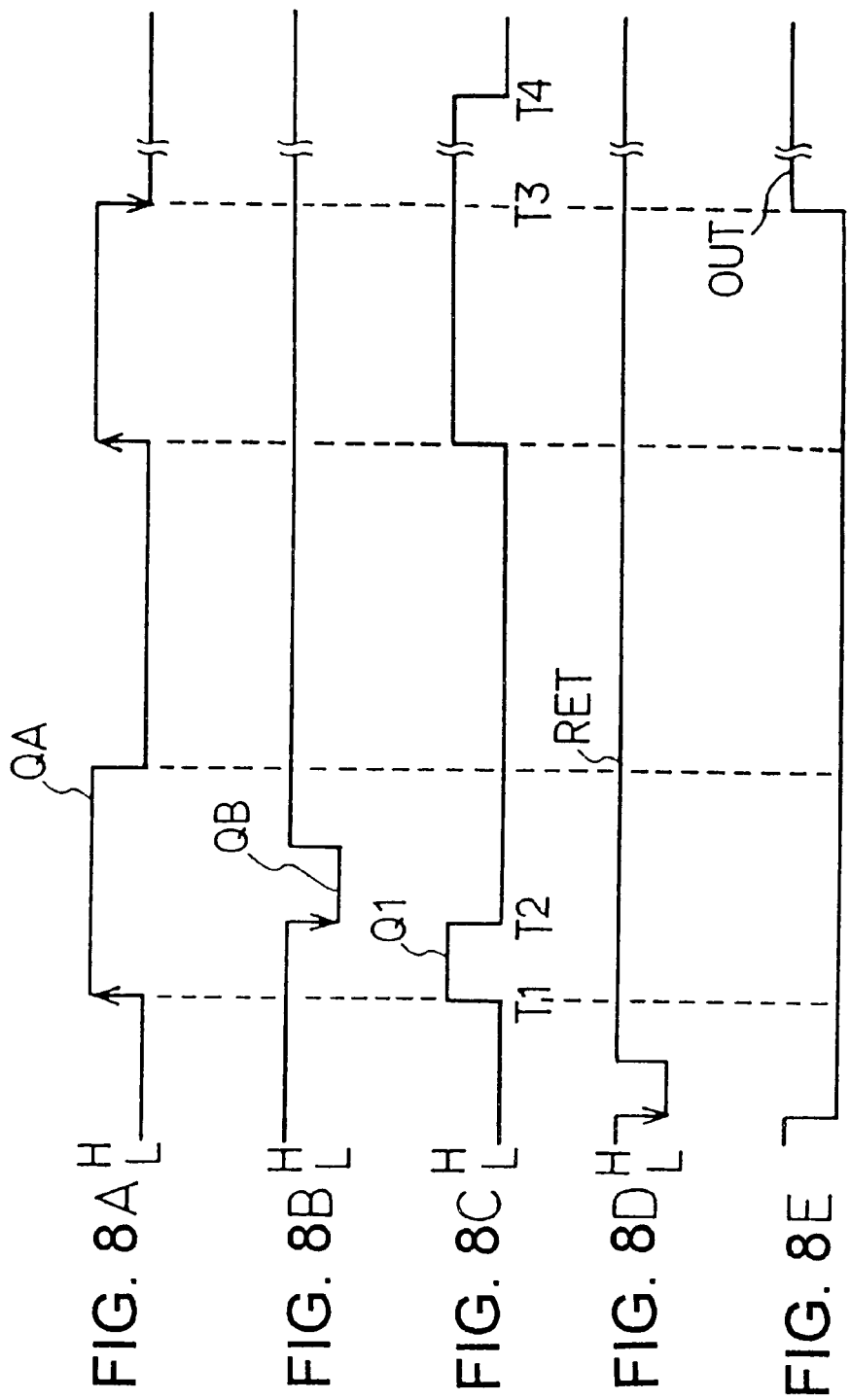
FIGS. 8A–8E illustrate waveforms for explaining the operation of the IC detecting circuit shown in FIG. 7.
Figure 9:
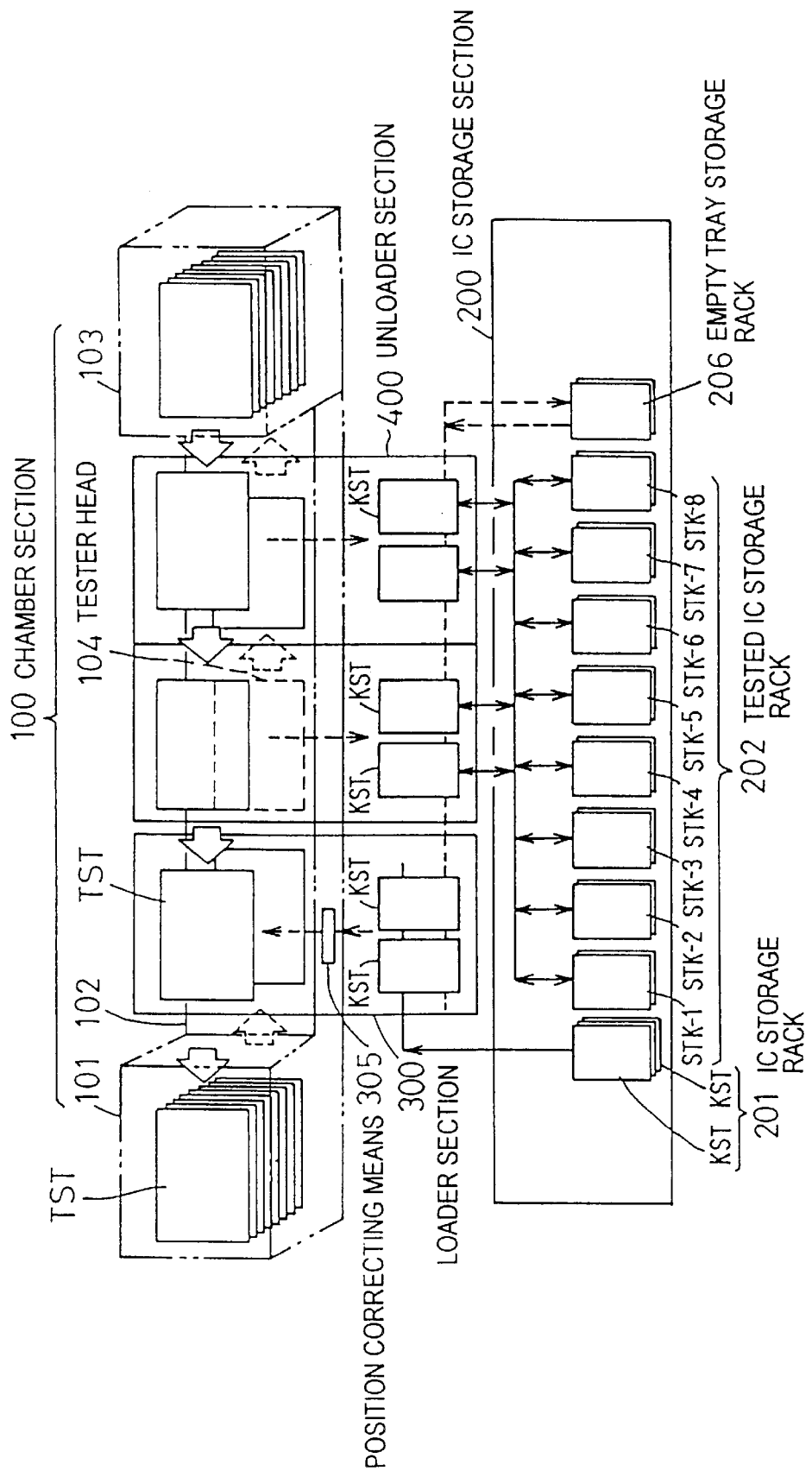
FIG. 9 is a plan view schematically showing a conventional IC testing apparatus with the chamber section viewed in perspective.

The waveform illustrated in FIG. 8 indicates that an IC exists in the second IC carrier 16 in the first IC carrier array. Accordingly, during the time duration that the second timing signal QA is rising to H logic level, the AND gate continues to output H logic level. Consequently, the second flip-flop FF2 reads therein H logic level outputted from the first flip-flop FF1 with a timing T3 of fall of the second timing signal QA (FIG. 8E).

Since the second flip-flop FF2 has its output signal fed back to its data terminal D via an OR gate OR1, once the second flip-flop FF2 reads H logic level therein, it continues to output H logic level until a timing T4 at which a reset signal RET shown in FIG. 8D falls to L logic level, even if the output of the first flip-flop FF1 changes.

By supplying the output of each of the second flip-flops FF2 forming a part of the IC detecting circuit to an OR gate OR2 to take out an OR thereof, and outputting the result of OR to an output terminal 70, each second flip-flop being provided in correspondence to each IC carrier array, an output signal OUT is supplied to the output terminal 70 shown in FIG. 8E.

With H logic level outputted to the output terminal 70, it is known that an IC is left on the test tray TST. Therefore, by inputting the output signal OUT of the output terminal 70, for instance, to a controller (not shown), it is possible to cause the controller to execute a control such as issuance of an alarm from the controller, or stopping of the operation of the handler, or the like.

Further, the embodiment shown in FIG. 7 illustrates an event in which it is applied to the detection of an IC being left on the test tray TST which ought to be emptied of ICs. If the circuit construction is such that the first flip-flop FF1 stores therein H logic level when an IC does not exist in the IC carrier 16, and stores therein L logic level when an IC exists in the IC carrier 16, and that H logic level stored in the first flip-flop FF1 is stored in the second flip-flop FF2 with a timing of fall of the timing signal QA, the method can be utilized in the case of detecting the fact that an IC loaded on the test tray TST in the loader section 300 drops down out of the test tray during the time interval until the test tray is discharged to the unloader section 400.

Moreover, it is needless to say that the present invention can be also applied to an IC testing apparatus having a magazine/tray type handler connected thereto of the type which can be used in common in transferring ICs accommodated in an IC container called a "rod-like magazine" and ICs loaded on a general-purpose tray onto a test tray and transporting the test tray loaded with the ICs thereon to the test section for testing, followed by various processings of the tested ICs on the basis of the data of the test results, and the same function and effects can be obtained therefrom. In case of using the handler of this type, ICs accommodated in a rod-like magazine are successively slid down by their own weights, that is, ICs are discharged out of the magazine by the natural dropping force of each IC by its own weight by supporting the rod-like magazine in an inclined state from its horizontal state, and a station where ICs discharged out of the magazine are transferred onto a test tray is defined as a loader section.

As explained above, according to the present invention, a feature for detecting an IC remaining on a test tray TST which should have been emptied of the tested ICs is added thereto. Therefore, it is possible to prevent from occurring in the loader section (including the station where ICs discharged out of the rod-like magazine are transferred onto a test tray) an erroneous operation that an IC is loaded on the remaining IC in the form of a stack. Consequently, an accident can be prevented that, for example, an IC drops out of the test tray in the constant temperature chamber 101 whereby a transporting apparatus located therebelow can be damaged. In addition, an erroneous classification can be prevented that the upper IC in the stack is transported without being dropped out of the test tray, is tested, and is discharged to the unloader section 400 where the upper IC is sorted out on the basis of the test results of the lower IC in the stack.

Further, according to the present invention, even if an IC drops from the test tray during the test in the test section or during the transportation time of the test tray from the test section to the unloader section 400, the dropping of the IC can be detected. Therefore, an erroneous operation can be prevented that an IC is virtually classified from the IC pocket on the test tray in which any IC is absent in accordance with the test results stored in the memory means. That is, a classifying operation with respect to the IC pocket on the test tray in which no IC exists can be eliminated and the time required for the entire classifying operation can be reduced.

In addition, according to the present invention, even if an empty IC pocket exists on a test tray TST transported to the test section due to a case that an IC is dropped out of the test tray during the transportation time of the test tray from the loader section to the test section, or that the test tray is transported to the test section with an IC pocket emptied of an IC because an IC to be tested could not have been loaded on the test tray in the loader section, this empty IC pocket can be detected. Therefore, the test for the empty IC pocket can be eliminated. As a result, a wasteful test is not performed, and so the testing time can be reduced and a high reliable IC testing apparatus can be provided.

Further, according to the present invention, since the arrangement is such that whether an IC exists or not in the IC carrier is detected by a timing mark, the presence/absence of an IC on the test tray can surely be detected.

While the present invention has been described in the above as being applied to the IC testing apparatus for testing ICs as semiconductor devices, it is needless to say that the present invention is also applicable to testing apparatus for testing semiconductor devices other than ICs, and the same function and effects are obtained as described above.

What is claimed is:

1. A semiconductor device testing apparatus comprising:
   a tester part comprising a semiconductor tester;
   a handler part comprising:
      a loader section,
      a chamber section comprising:
         a constant temperature chamber;
         a test chamber in which the semiconductor tester is disposed; and
         a temperature-stress removing chamber, and
      an unloader section;
   a plurality of test trays, each including a plurality of device carriers which are disposed in orthogonal transverse rows and longitudinal rows, wherein
      each of the test trays is loaded with semiconductor devices to be tested in the device carriers at the loader section of said handler part,
      said test tray thus loaded with the semiconductor devices is transported from said loader section through the constant temperature chamber into the test chamber where the semiconductor devices thus transported are tested by the semiconductor tester,
      after the completion of the test, said test tray loaded with the tested semiconductor devices is transported from said test chamber through the temperature-stress removing chamber to the unloader section of said handler part where the tested semiconductor devices on said test tray are transferred from said test tray onto a general-purpose tray, and
      the test tray which has been emptied of the tested semiconductor devices is transported from said unloader section to said loader section, and the above transportation is repeated,
      the transverse rows of the device carriers of the test tray are aligned in parallel to a transporting direction of the test tray;
      on the way of a test tray transporting path from said unloader section to said loader section, there is provided a semiconductor device detecting sensor detecting whether a semiconductor device exists in the device carriers of the test tray which passes through the semiconductor device detecting sensor or not; and
   alarm circuitry monitoring an empty state of all of the device carriers of each of the test trays passing through the semiconductor device detecting sensor on an output of said semiconductor device detecting sensor and issuing a warning alarm when said alarm circuitry detects an output signal from said semiconductor device detecting sensor representing the presence of any semiconductor device remaining on the test tray transported from said unloader section to said loader section.

2. The semiconductor device testing apparatus according to claim 1, wherein said handler part is a magazine/tray type handler of the type which can be used in common in transferring semiconductor devices accommodated in a semiconductor device container called a "rod-like magazine" and semiconductor devices loaded on a general-purpose tray onto a test tray and transporting the test tray loaded with the semiconductor devices thereon to the test section for testing, followed by performing various processings on the tested semiconductor devices on the basis of the data of the test results in the unloader section, and said loader section is a station where semiconductor devices discharged out of the magazine are transferred onto a test tray.

3. The semiconductor device testing apparatus according to claim 1, wherein said handler part is a handler called a "horizontal transporting system" in which semiconductor devices loaded on a general-purpose tray are transferred onto a test tray in said loader section, and the test tray loaded with the semiconductor devices thereon is transported to the test section for testing, followed by performing various processings on the tested semiconductor devices on the basis of the data of the test results in said unloader section.

4. The semiconductor device testing apparatus according to claim 1, wherein:
the transverse rows of the device carriers of the test tray are aligned in parallel to a transporting direction of the test tray;
on the way of a second test tray transporting path from said test section to said unloader section there is provided a second semiconductor device detecting sensor detecting whether a semiconductor device exists in the device carriers of the test tray or not; and
said alarm circuitry further monitors a full loading state of all of the device carriers of each test tray passing through the second semiconductor device detecting sensor on an output of said second semiconductor device detecting sensor and issues a warning alarm when said alarm circuitry detects an output signal from said second semiconductor device detecting sensor representing the presence of any empty semiconductor device carrier having no semiconductor device therein of the test tray transported from said test chamber to said unloader section.

5. The semiconductor device testing apparatus according to claim 1, wherein:
the transverse rows of the device carriers of the test tray are aligned in parallel to a transporting direction of the test tray;
on the way of a second test tray transporting path from said loader section to said test chamber, there is provided a second semiconductor device detecting sensor detecting whether a semiconductor device exists in the device carriers of the test tray or not; and
said alarm circuitry further monitors a full loading state of all of the device carriers of each test tray, passing through the second semiconductor device detecting sensor on an output of said second semiconductor device detecting sensor and issues a warning alarm when said alarm circuitry detects an output signal from said second semiconductor device detecting sensor representing the presence of any empty semiconductor device carrier having no semiconductor device therein of the test tray transported from said loader section to said test chamber.

6. The semiconductor device testing apparatus according to claim 4, wherein:
the transverse rows of the device carriers of the test tray are aligned in parallel to a transporting direction of the test tray;
on the way of a third test tray transporting path from said loader section to said test chamber, there is provided a third semiconductor device detecting sensor detecting whether a semiconductor device exists in the device carriers of the test tray or not; and
said alarm circuitry further monitors a full loading state of all of the device carriers of each test tray through the third semiconductor device detecting sensor on an output of said third semiconductor device detecting sensor and issues a warning alarm when said alarm circuitry detects an output signal from said third semiconductor device detecting sensor representing the presence of any empty semiconductor device carrier having no semiconductor device therein of the test tray transported from said loader section to said test chamber.

7. The semiconductor device testing apparatus according to claim 1, wherein said semiconductor device detecting sensor comprises a plurality of semiconductor device detecting sensor units, the number of which is equal to that of the semiconductor device carriers aligned in one longitudinal row thereof and which units are disposed to correspond to the respective transverse rows of the device carriers on the test tray.

8. The semiconductor device testing apparatus according to claim 7, wherein each sensor unit is an optical sensor including a pair of a light source unit and a light receiving unit detecting transmitted light from the light source unit through a corresponding one device carrier.

9. The semiconductor device testing apparatus according to claim 8, wherein each of said test trays further includes a series of timing marks provided on a side frame of the test tray at predetermined intervals equal to that of the device carriers in the transverse row thereof, and said semiconductor device detecting sensors further comprise a timing detecting sensor unit detecting said timing marks to thereby enable a detection timing of the device carriers by the semiconductor device detecting sensor units aligned in one longitudinal row of the device carriers to be in synchronism with a detection timing of the timing marks by the timing detecting sensor unit.

10. The semiconductor device testing apparatus according to claim 7, wherein each sensor unit is a camera having a pattern recognition function.

11. The semiconductor device testing apparatus according to claim 9, wherein said timing detecting sensor unit is a reflected light detecting type optical sensor detecting reflected light, and said timing marks provided on the side frame of the test tray are reflective marks which reflects light, and wherein said timing detecting sensor detects light reflected from the reflective marks provided on the side frame and the presence of a semiconductor device on the test tray is determined by a detected signal outputted from said semiconductor device detecting sensor in synchronism with the detection of the reflected light.

12. The semiconductor device testing apparatus according to claim 9, wherein said timing detecting sensor is a reflected light detecting type optical sensor detecting reflected light, said series of timing marks provided on the frame of the test tray are non-reflective marks which do not reflect light, and the frame of the test tray is made of a light-reflective material, and wherein said timing detecting sensor detects the non-reflective marks provided on the frame and the presence of a semiconductor device on the test tray is determined by a detected signal outputted from said semiconductor device detecting sensor in synchronism with the detection of the non-reflective marks.

13. The semiconductor device testing apparatus according to claim 9, wherein said timing detecting sensor is a transmitted light detecting type optical sensor detecting transmitted light, and said series of timing marks provided in the frame of the test tray are a series of slits through which light passes, and wherein said timing detecting sensor detects light transmitted through the slits provided in the frame and the presence of a semiconductor device on the test tray is determined by a detected signal outputted from said semiconductor device detecting sensor in synchronism with the detection of the transmitted light.

14. The semiconductor device testing apparatus according to claim 9, wherein said timing detecting sensor is a transmitted light detecting type optical sensor for detecting transmitted light, and said timing mark provided on the frame of the test tray is a positioning pin inserting hole formed in each of the semiconductor device carriers mounted to the test tray and through which light passes, and wherein said timing detecting sensor detects light transmitted through the positioning pin inserting hole and the presence of a semiconductor device on the test tray is determined by a detected signal outputted from said semiconductor device detecting sensor in synchronism with the detection of the transmitted light.

15. The semiconductor device testing apparatus according to claim 11, wherein said reflective or non-reflective mark are provided on one side of the frame of the test tray, said one side of the frame being parallel to the transporting direction of the test tray and said reflective or non-reflective marks being provided on the positions on said one side corresponding to the central portions of the respective semiconductor device carriers in the test tray which are aligned in the transporting direction of the test tray.

16. The semiconductor device testing apparatus according to claim 7, wherein each of said semiconductor device detecting sensors comprises a pair of a light source and a photodetector, said light source is disposed at one side of the plane through which the test tray passes and said photodetector is disposed at the other side of the plane, a through-hole is formed in a bottom portion of each of the semiconductor device carriers mounted to the test tray at about central portions thereof, and the presence of a semiconductor device on the test tray is determined by detecting whether light from said light source passes through the through-hole or not by said photodetector.

17. The semiconductor device testing apparatus according to claim 7, wherein each of said semiconductor device detecting sensors comprises:
- a timing detecting sensor detecting a series of timing marks provided on a side frame of the test tray at predetermined intervals relative to the moving direction of the test tray;
- an interrupt signal generating circuit generating an interrupt signal in response to a logic signal of one logic level outputted from said timing detecting sensor each time said sensor detects the timing mark;
- a plurality of latch circuits latching detected signals of the corresponding number of the semiconductor device detecting sensors, respectively; and
- a controller comprising a central processing unit, a ROM in which programs have been stored, a RAM temporarily storing therein data read in said controller, an input port to which the output signal of each of said latch circuits is supplied, an interrupt input port to which the interrupt signal of said interrupt signal generating circuit is supplied, and an output port.

18. The semiconductor device testing apparatus according to claim 7, wherein said semiconductor device detecting sensor comprises:
- a timing detecting sensor detecting a series of timing marks provided on a frame of the test tray at predetermined intervals relative to the transporting direction of the test tray;
- an AND gate removing detected signals of a plurality of semiconductor device detecting sensors;
- a first flip-flop storing therein a logic signal of one logic level when a corresponding semiconductor device detecting sensor has detected transmitted light through the through-hole of the semiconductor device carrier in the state that the timing detecting sensor has been detecting the timing mark and outputting the stored content, and storing therein a logic signal of the other logic level when the semiconductor device detecting sensor has not detected transmitted light through the through-hole in the state that the timing detecting sensor has been detecting the timing mark and outputting the stored content; and
- a second flip-flop removing, once said first flip-flop has outputted the logic signal of the other logic level by detection of the presence of a semiconductor device, this logic signal and retaining the logic signal of the other logic level therein until the test tray has passed.

19. The semiconductor device testing apparatus according to claim 7, wherein each sensor unit is a proximity switch detecting a metallic portion in each semiconductor device.

20. The semiconductor device testing apparatus according to claim 6, wherein each of said semiconductor device detecting sensors comprises a plurality of semiconductor device detecting sensor units, the number of which is equal to that of the semiconductor device carriers aligned in one longitudinal row thereof and which units are disposed to correspond to the respective transverse rows of the device carriers on the test tray.

21. The semiconductor device testing apparatus according to claim 7, wherein each of said semiconductor device detecting sensors comprises a plurality of semiconductor device detecting sensor units, the number of which is equal to that of the semiconductor device carriers aligned in one longitudinal row thereof and which units are disposed to correspond to the respective transverse rows of the device carriers on the test tray.

22. The semiconductor device testing apparatus according to claim 8, wherein each of said semiconductor device detecting sensors comprises a plurality of semiconductor device detecting sensor units, the number of which is equal to that of the semiconductor device carriers aligned in one longitudinal row thereof and which units are disposed to correspond to the respective transverse rows of the device carriers on the test tray.

23. A semiconductor device testing apparatus comprising:
- a tester part comprising a semiconductor tester;
- a handler part comprising:
  - a loader section,
  - a chamber section comprising:
    - a constant temperature chamber;

a test chamber in which the semiconductor tester is disposed; and
a temperature-stress removing chamber, and
an unloader section; and
a plurality of test trays each having a plurality of device carriers which are disposed in orthogonal transverse rows and longitudinal columns,
wherein
each of the test trays is loaded with semiconductor devices to be tested in the device carriers at the loader section of said handler part,
said test tray thus loaded with the semiconductor devices is transported from said loader section through the constant temperature chamber into the test chamber where the semiconductor devices thus transported are tested by the semiconductor tester,
after the completion of the test, said test tray loaded with the tested semiconductor devices is transported from said test chamber through the temperature-stress removing chamber to the unloader section of said handler part where the tested semiconductor devices on said test tray are transferred from said test tray onto a general-purpose tray, and
the test tray which has been emptied of the tested semiconductor devices is transported from said unloader section to said loader section, and the above transportation of the test tray is repeated,
the transverse rows of the device carriers of the test tray are aligned in parallel to a transporting direction of the test tray;
on the way of a test tray transporting path from said test chamber to said unloader section, there is provided a semiconduct device detecting sensor detecting whether a semiconductor device exists in the device carriers of the test tray or not; and
alarm circuitry monitoring a full loading state of all of the device carriers of each test tray passing through the semiconductor device detecting sensor on an output of said semiconductor device detecting sensor and issuing a warning alarm when said alarm circuitry detects an output signal from said semiconductor device detecting sensor representing the presence of any empty semiconductor device carrier having no semiconductor device therein of the test tray transported from said test chamber to said unloader chamber.

24. The semiconductor device testing apparatus according to claim 23, wherein said semiconductor device detecting sensor comprises a plurality of semiconductor device detecting sensor units, the number of which is equal to that of the semiconductor device carriers aligned in one longitudinal row thereof and which units are disposed to correspond to the respective transverse rows of the device carriers on the test tray.

25. A semiconductor device testing apparatus comprising:
a tester part comprising a semiconductor tester;
a handler part comprising:
    a loader section,
    a chamber section comprising:
        a constant temperature chamber;
        a test chamber in which the semiconductor tester is disposed; and
        a temperature-stress removing chamber, and
    an unloader section;
a plurality of test trays each having a plurality of device carriers which are disposed on orthogonal transverse rows and longitudinal columns,
wherein
each of the test trays is loaded with semiconductor devices to be tested in the device carriers at the loader section of said handler part,
said test tray thus loaded with the semiconductor devices is transported from said loader section through the constant temperature chamber into the test chamber where the semiconductor devices thus transported are tested by the semiconductor tester,
after the completion of the test, said test tray loaded with the tested semiconductor devices is transported from said test chamber through the temperature-stress removing chamber to the unloader section of said handler part where the tested semiconductor devices on said test tray are transferred from said test tray onto a general-purpose tray, and
the test tray which has been emptied of the tested semiconductor devices is transported from said unloader section to said loader section, and the above transportation of the test tray is repeated,
the transverse rows of the device carriers of the test tray are aligned in parallel to a transporting direction of the test tray;
on the way of a test tray transporting path from said loader section to said test chamber, there is provided a semiconductor device detecting sensor detecting whether a semiconductor device exists in the device carriers of the test tray or not; and
alarm circuitry monitoring a full loading state of all of the device carriers of each test tray passing through the semiconductor device detecting sensor on an output of said semiconductor device detecting sensor and issuing a warning alarm when said alarm circuitry detects an output signal from said semiconductor device detecting sensor representing the presence of any empty semiconductor device carrier having no semiconductor device therein of the test tray transported from said loader section to said test chamber.

26. The semiconductor device testing apparatus according to claim 25, wherein said semiconductor device detecting sensor comprises a plurality of semiconductor device detecting sensor units, the number of which is equal to that of the semiconductor device carriers aligned in one longitudinal row thereof and which units are disposed to correspond to the respective transverse rows of the device carriers on the test tray.

27. A semiconductor device detecting method used in a semiconductor device testing apparatus, said semiconductor device testing apparatus including a tester part and a handler part and wherein semiconductor devices to be tested are transferred to a test tray being stopped at a loader section of said handler part to be reloaded thereon in said loader section, said test tray is transported from said loader section into a test section of said handler part to test the semiconductor devices, after the completion of the test, said test tray with the tested semiconductor devices loaded thereon is transported from said test section to an unloader section of said handler part where the tested semiconductor devices on said test tray are transferred from said test tray onto a general-purpose tray, and the test tray which has been emptied of the tested semiconductor devices is transported from said unloader section to said loader section, and the above operation is repeated, said method comprising the steps of:
detecting light passing through a through-hole formed in the bottom portion of each of semiconductor device carriers mounted to a test tray during the time duration that the test tray is transporting;

detecting a series of timing marks provided on a side frame of the test tray at predetermined intervals relative to the moving direction of the test tray; and determining that there is no semiconductor device in each of the semiconductor device carriers when light passing through a through-hole formed in that semiconductor device carrier of the test tray is detected during the time interval that the timing mark is detecting, and issuing an alarm indicating that there is a semiconductor device in a semiconductor device carrier when light passing through a through-hole formed in that semiconductor device receiving portion of the test tray is not detected during the time interval that the timing mark is detecting.

28. A semiconductor device testing apparatus comprising:

a tester comprising a semiconductor test head;

a handler comprising:
  a loader section,
  a chamber section comprising:
    a constant temperature chamber;
    a test chamber having a test section in which the semiconductor test head is disposed; and
    a temperature-stress removing chamber, and
  an unloader section;

a plurality of test trays, each including a plurality of device carriers;

at least one semiconductor device detecting sensor; and alarm circuitry, wherein:
  said handler is constructed that:
    each of the test trays is loaded with semiconductor devices to be tested in the device carriers at the loader section of said handler,
    one of said test trays thus loaded with the semiconductor devices is transported from said loader section through the constant temperature chamber into the test chamber where the semiconductor devices thus transported are contacted to the test head at the test section to thereby undergo a predetermined test by the tester,
    after completion of the test, said one of the said test trays loaded with the tested semiconductor devices is transported from said test chamber through the temperature-stress removing chamber to the unloader section of said handler where the tested semiconductor devices on said test tray are transferred from said test tray onto a general-purpose tray, and
    the one of the test trays which has been emptied is transported from the unloader section to the loader section, and the thus emptied test tray is loaded thereon anew with semiconductor devices to be tested, so that the above-mentioned operation is repeated;
    a semiconductor device detecting sensor is provided in at least a selected one of a first tray transporting path from said unloader section to said loader section, a second tray transporting path from said loader section to said test chamber, and a third tray transporting path from said test chamber to said unloader section, which form a tray transporting circle so that said semiconductor device detecting sensor detects whether a semiconductor device exists in each of the device carriers of each test tray which passes through the semiconductor device detecting sensor and generates two different output signals representing, respectively, the presence and absence of the semiconductor device in each of the device carriers of each test tray under detection; and
    said alarm circuitry receives the output signals from the semiconductor device detecting sensor and issues a warning alarm when said alarm circuitry detects one of the two output signals from the semiconductor device detecting sensor which represents an unusual state of the presence or absence of any semiconductor device on the test tray which is transported in said selected one tray transporting path.

29. The semiconductor device testing apparatus according to claim 28, wherein
  a semiconductor device detecting sensor is provided in said first tray transporting path, and
  said alarm circuitry receives the output signals from the semiconductor device detecting sensor and issues a warning alarm when said alarm circuitry detects one of the two output signals from the semiconductor device detecting sensor which represents the unusual state of the presence of any semiconductor device on the test tray which is transported in said first tray transporting path.

30. The semiconductor device testing apparatus according to claim 28, wherein
  a semiconductor device detecting sensor is provided in said second tray transporting path, and
  said alarm circuitry receives the output signals from the semiconductor device detecting sensor and issues a warning alarm when said alarm circuitry detects one of the two output signals from the semiconductor device detecting sensor which represents the unusual state of the absence of any semiconductor device on the test tray which is transported in said second tray transporting path.

31. The semiconductor device testing apparatus according to claim 28, wherein
  a semiconductor device detecting sensor is provided in said third tray transporting path, and
  said alarm circuitry receives the output signals from the semiconductor device detecting sensor and issues a warning alarm when said alarm circuitry detects one of the two output signals from the semiconductor device detecting sensor which represents the unusual state of the absence of any semiconductor device on the test tray which is transported in said third tray transporting path.

* * * * *

UNITED STATES PATENT AND TRADEMARK OFFICE
CERTIFICATE OF CORRECTION

PATENT NO.: 6,111,246
DATED : August 29, 2000
INVENTOR(S): Yutaka WATANABE, et al.

It is certified that an error appears in the above-identified patent and that said Letters Patent is hereby corrected as shown below:

[75] Inventors:

change "Kitasaitama-gun" to --Kitasaitama--.

Col. 3, line 43, delete "."

Signed and Sealed this

Twenty-ninth Day of May, 2001

Attest:

NICHOLAS P. GODICI

*Attesting Officer*   *Acting Director of the United States Patent and Trademark Office*